United States Patent
Simsek-Ege

(10) Patent No.: US 12,532,778 B2
(45) Date of Patent: Jan. 20, 2026

(54) MICROELECTRONIC DEVICES INCLUDING MULTIPLE DIES RESPECTIVELY INCLUDING VERTICAL STACKS OF MEMORY CELLS, AND RELATED ELECTRONIC SYSTEMS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 705 days.

(21) Appl. No.: 17/804,258

(22) Filed: May 26, 2022

(65) Prior Publication Data

US 2023/0411352 A1 Dec. 21, 2023

(51) Int. Cl.
| | |
|---|---|
| *H01L 25/065* | (2023.01) |
| *H01L 23/00* | (2006.01) |
| *H01L 25/18* | (2023.01) |
| *H10B 12/00* | (2023.01) |
| *H10B 41/23* | (2023.01) |
| *H10B 43/27* | (2023.01) |

(52) U.S. Cl.
CPC .......... *H01L 25/0657* (2013.01); *H01L 24/08* (2013.01); *H10B 12/315* (2023.02); *H10B 41/23* (2023.02); *H10B 43/27* (2023.02); *H01L 2224/08146* (2013.01)

(58) Field of Classification Search
CPC ................. H01L 25/0657; H01L 24/08; H01L 2224/08146; H01L 25/18; H10B 12/315; H10B 41/23; H10B 43/27; H10B 12/05; H10B 12/09; H10B 12/50
See application file for complete search history.

(56) References Cited

U.S. PATENT DOCUMENTS

| | | | |
|---|---|---|---|
| 5,901,099 A | 5/1999 | Gilliam et al. | |
| 6,778,452 B2 | 8/2004 | Beigel et al. | |
| 8,067,286 B2 | 11/2011 | Parekh et al. | |
| 8,153,499 B2 | 4/2012 | Or-Bach et al. | |
| 8,184,471 B2 | 5/2012 | Woo et al. | |
| 8,546,188 B2 | 10/2013 | Liu et al. | |

(Continued)

*Primary Examiner* — Herve-Louis Y Assouman
(74) *Attorney, Agent, or Firm* — TraskBritt

(57) ABSTRACT

A microelectronic device comprises a first microelectronic device structure, a second microelectronic device structure vertically neighboring the first microelectronic device structure, and a third microelectronic device structure vertically neighboring the second microelectronic device structure. The first microelectronic device structure comprises a first memory array region and the third microelectronic device structure comprises a second memory array region. The second microelectronic device structure comprises a control logic region comprising a first sub word liner driver region comprising transistor structures in electrical communication with structures of the first microelectronic device structure and a second sub word line driver region comprising additional transistor structures in electrical communication with structures of the third microelectronic device structure. Related microelectronic devices, electronic systems, and methods are also described.

22 Claims, 31 Drawing Sheets

(56) References Cited

U.S. PATENT DOCUMENTS

| | | | |
|---|---|---|---|
| 8,716,116 | B2 | 5/2014 | Parekh et al. |
| 9,543,433 | B2 | 1/2017 | Anathan et al. |
| 10,366,740 | B1 | 7/2019 | Kim et al. |
| 11,848,309 | B2 | 12/2023 | Simsek-Ege |
| 2014/0347945 | A1 | 11/2014 | Venkata et al. |
| 2018/0261575 | A1* | 9/2018 | Tagami .................. H10B 41/10 |
| 2019/0181142 | A1* | 6/2019 | Fishburn ................ H10B 12/02 |
| 2019/0244933 | A1 | 8/2019 | Or-Bach et al. |
| 2020/0066730 | A1 | 2/2020 | Guo et al. |
| 2020/0105721 | A1* | 4/2020 | Park ...................... H01L 23/528 |
| 2021/0217460 | A1 | 7/2021 | Montierth et al. |
| 2022/0123006 | A1* | 4/2022 | Ahn ....................... H10B 43/27 |
| 2022/0399308 | A1 | 12/2022 | Simsek-Ege et al. |
| 2023/0018127 | A1 | 1/2023 | Gandhi et al. |
| 2023/0207505 | A1 | 6/2023 | Simsek-Ege et al. |

\* cited by examiner

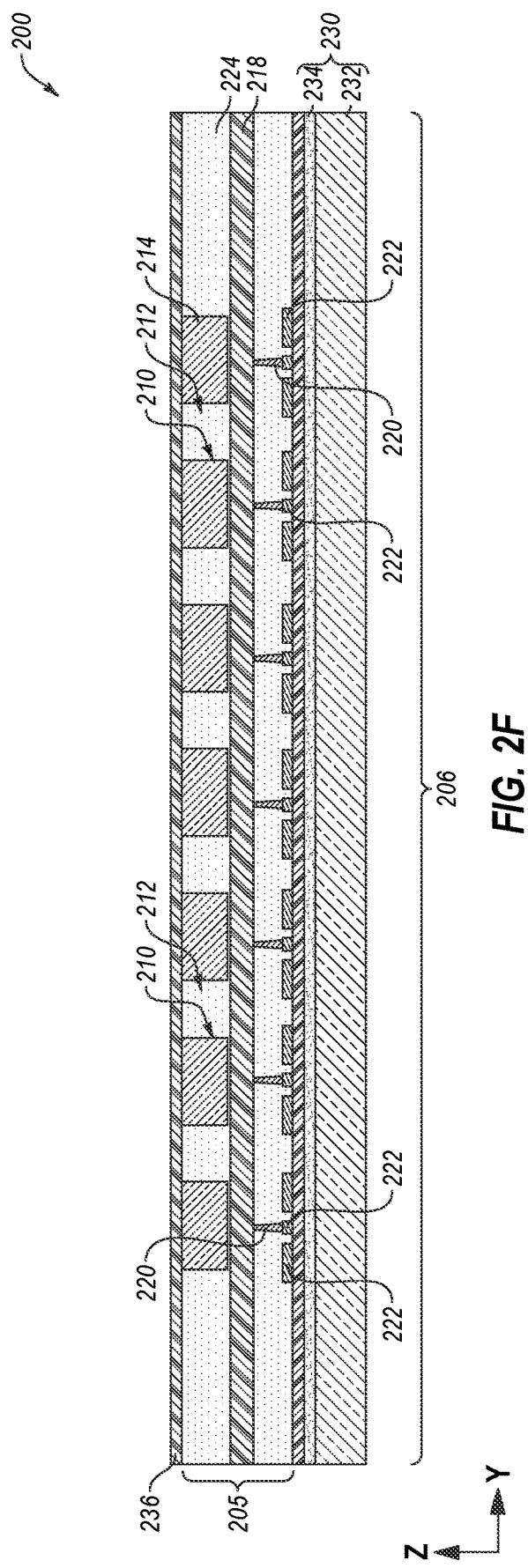

MICROELECTRONIC DEVICES INCLUDING MULTIPLE DIES RESPECTIVELY INCLUDING VERTICAL STACKS OF MEMORY CELLS, AND RELATED ELECTRONIC SYSTEMS

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

BRIEF DESCRIPTION OF THE DRAWINGS

FIG. 2A through FIG. 2M include a simplified partial top-down view (FIG. 2A) and simplified partial cross-sectional views (FIG. 2B through FIG. 2M) illustrating a second microelectronic device structure and a method of attaching the second microelectronic device structure to the first microelectronic device structure to form a first microelectronic device structure assembly, in accordance with embodiments of the disclosure;

DETAILED DESCRIPTION

Figure 1A:
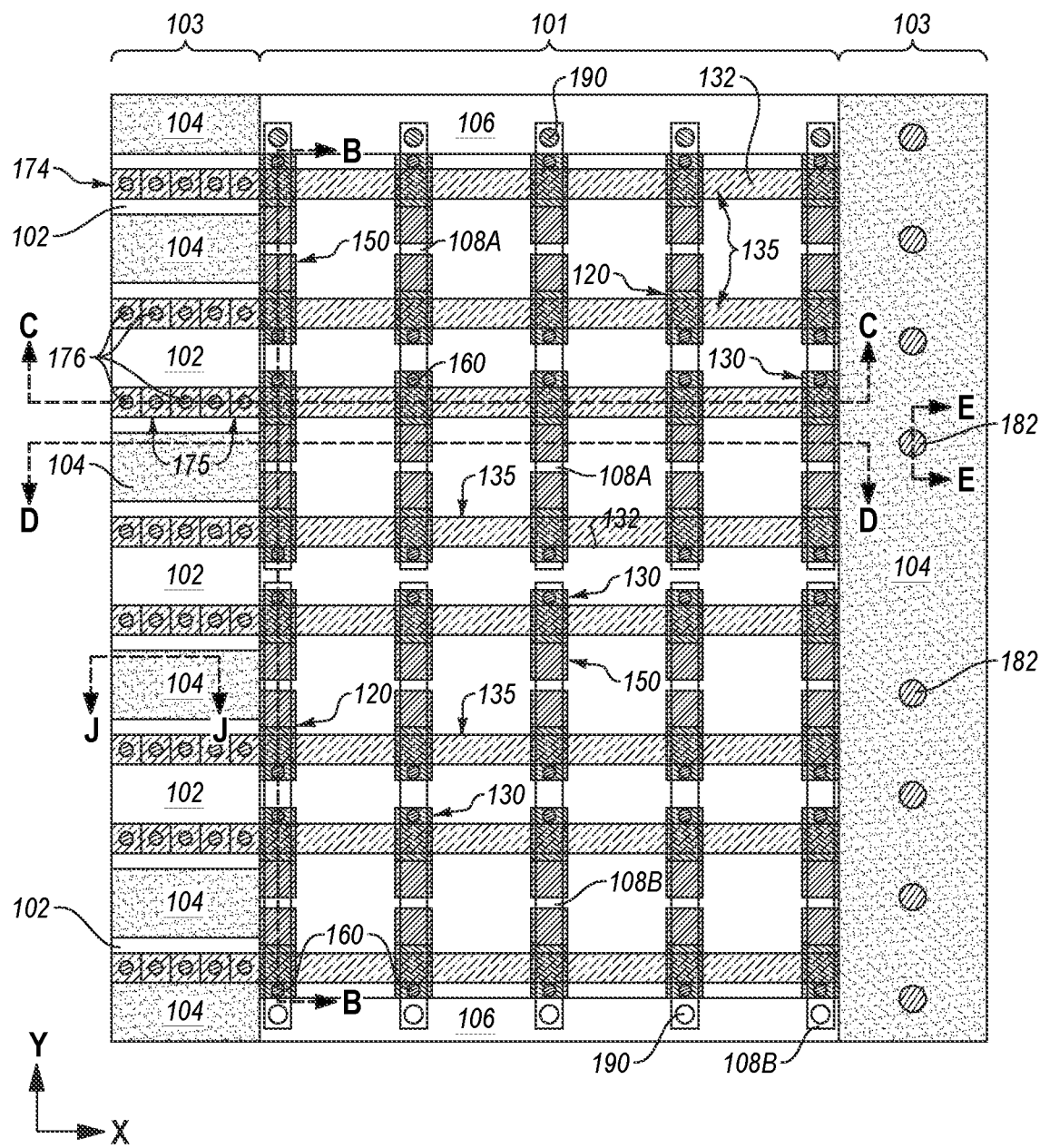
FIG. 1A through FIG. 1E include a simplified partial top-down view (FIG. 1A) and simplified partial cross-sectional views (FIG. 1B through FIG. 1E) illustrating a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma-enhanced ALD, physical vapor deposition (PVD), plasma-enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_y$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xZn_ySn_zO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

According to embodiments described herein, a microelectronic device includes a first microelectronic device structure including a first vertical stack of memory cells; a second microelectronic device structure vertically overlying the first microelectronic device structure and including a first control logic device region; and a third microelectronic device structure overlying the second microelectronic device structure and including a second vertical stack of memory cells and a second control logic device region. The first control logic device region includes control logic devices configured for effectuating control logic operations of each of the first vertical stack of memory cells and the second vertical stack of memory cells. In some embodiments, the first control logic device region includes a first sub word line driver region including sub word line drivers for the memory cells of the first microelectronic device structure and a second sub word line driver region including sub word line drivers for the memory cells of the third microelectronic device structure. In some embodiments, the first control logic device region further includes a first sense amplifier device region including sense amplifiers for memory cells of the first microelectronic device structure. The second control logic device region within the third microelectronic device structure may include a second sense amplifier device region including sense amplifiers for the memory cells of the third microelectronic device structure. The second control logic device region may include complementary metal-oxide-semiconductor (CMOS) circuitry and devices for effectuating control logic operations of the memory cells of the first microelectronic device structure and the memory cells of the third microelectronic device structure different than CMOS devices and circuitry of each of the first control logic device region, the second control logic device region, and the third control logic device region. A back end of line (BEOL) structure vertically overlies the third microelectronic device structure.

Forming the microelectronic device to include the second microelectronic device structure including the first control logic device region vertically between the first microelectronic device structure and the third microelectronic device structure may facilitate forming the microelectronic device to exhibit a reduced horizontal area (e.g., footprint) and an increased memory density compared to conventional microelectronic devices. For example, the vertical stacks of memory cells of the first microelectronic device structure and the third microelectronic device structure may be formed to include a greater number of levels of memory cells. Placing some of the control logic devices within the first control logic device region of the second microelectronic device structure and other control logic devices within the second control logic device region of the third microelectronic device structure facilitates forming a greater density of memory cells compared to conventional microelectronic devices.

FIG. 1A through FIG. 1E are a simplified partial top-down view (FIG. 1A) and simplified partial cross-sectional views (FIG. 1B through FIG. 1E) illustrating a first microelectronic device structure 100 to be included in a microelectronic device (e.g., a memory device, such as a 3D DRAM memory device) of the disclosure, in accordance with embodiments of the disclosure. With the description provided below, it will be readily apparent to one of ordinary skill in the art that the methods and structures described herein with reference to FIG. 1A through FIG. 1E may be used in various devices and electronic systems. The first microelectronic device structure 100 may also be referred to herein as a first die or a first wafer.

Figure 1B:
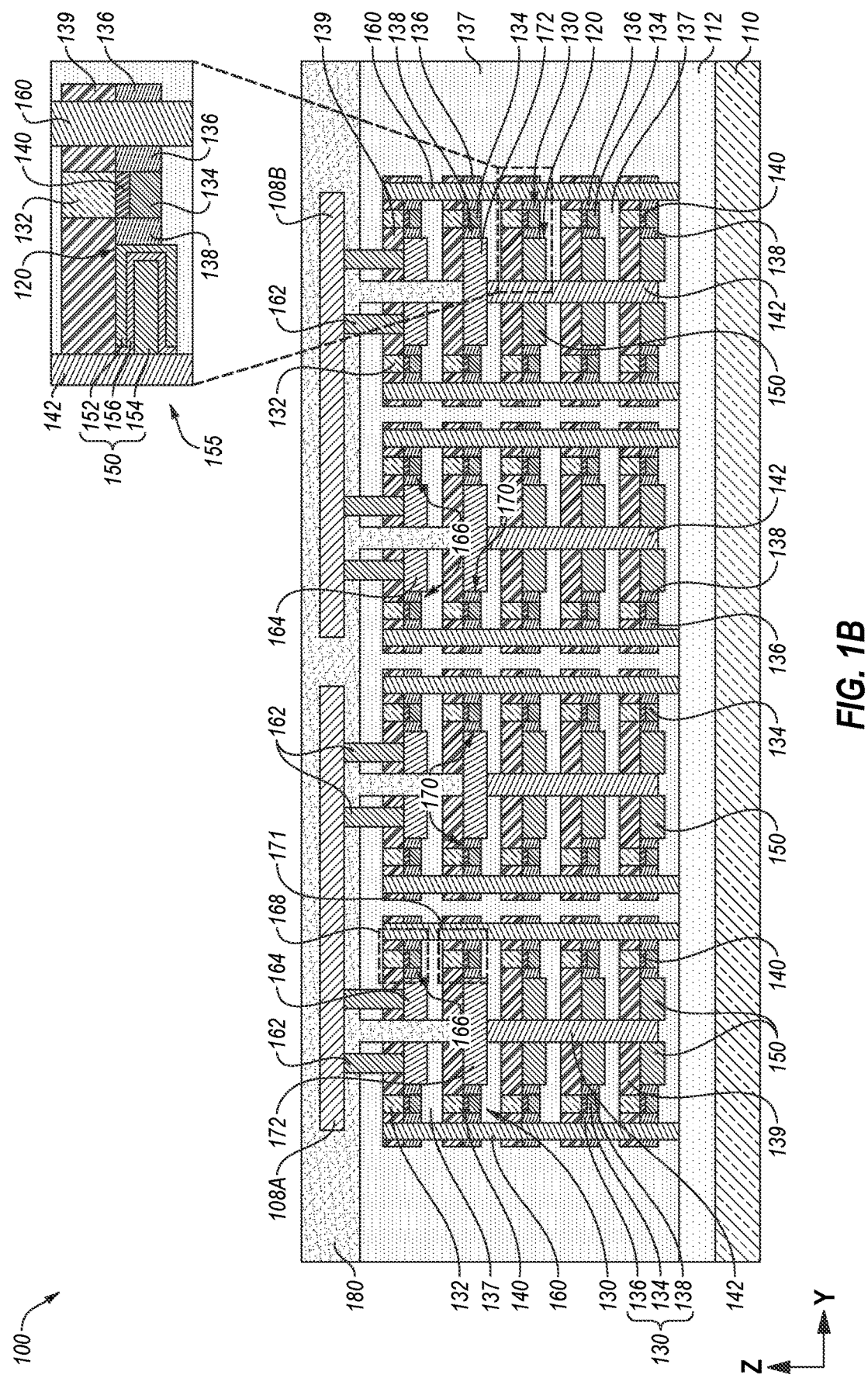
Figure 1C:
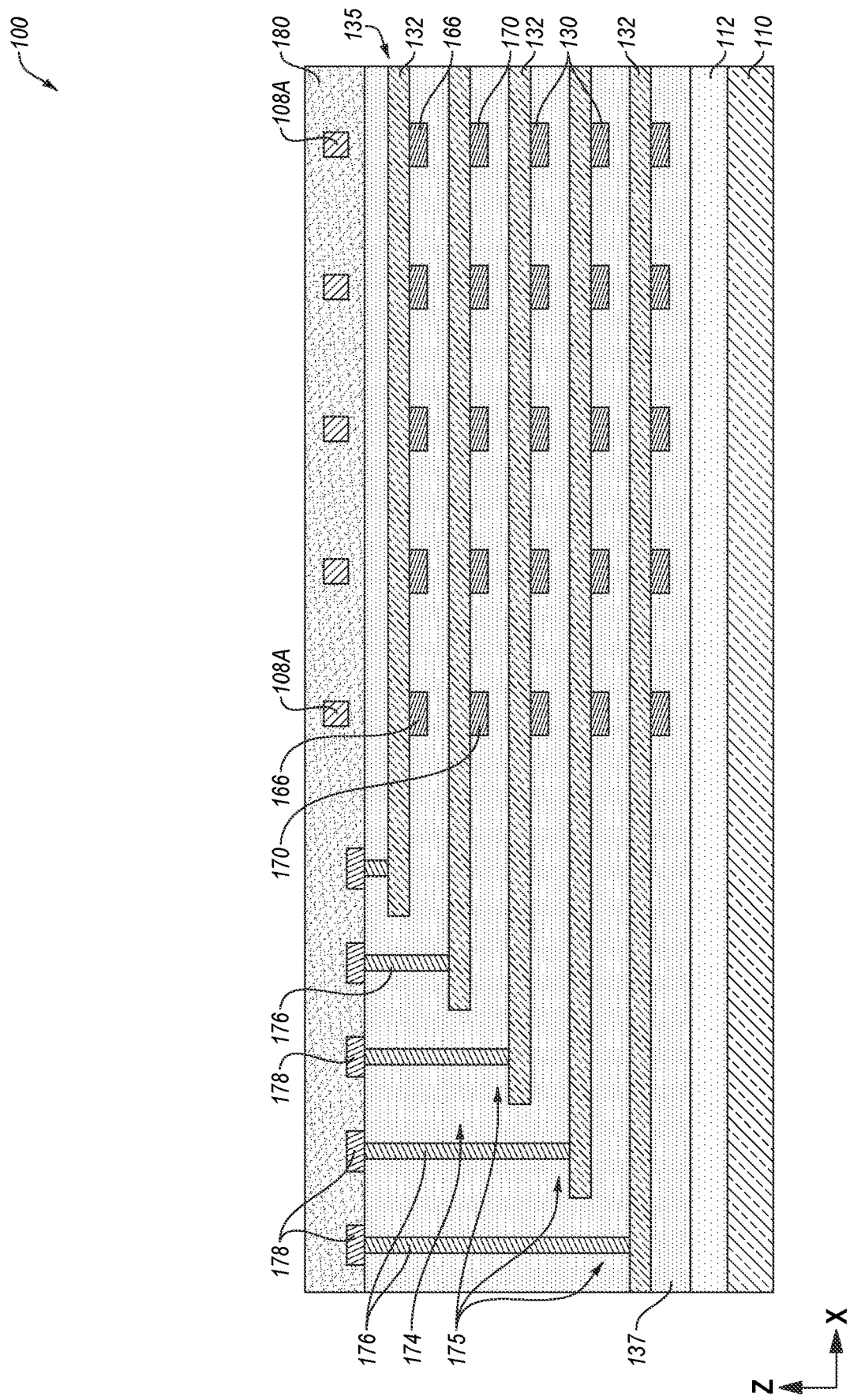
Figure 1D:
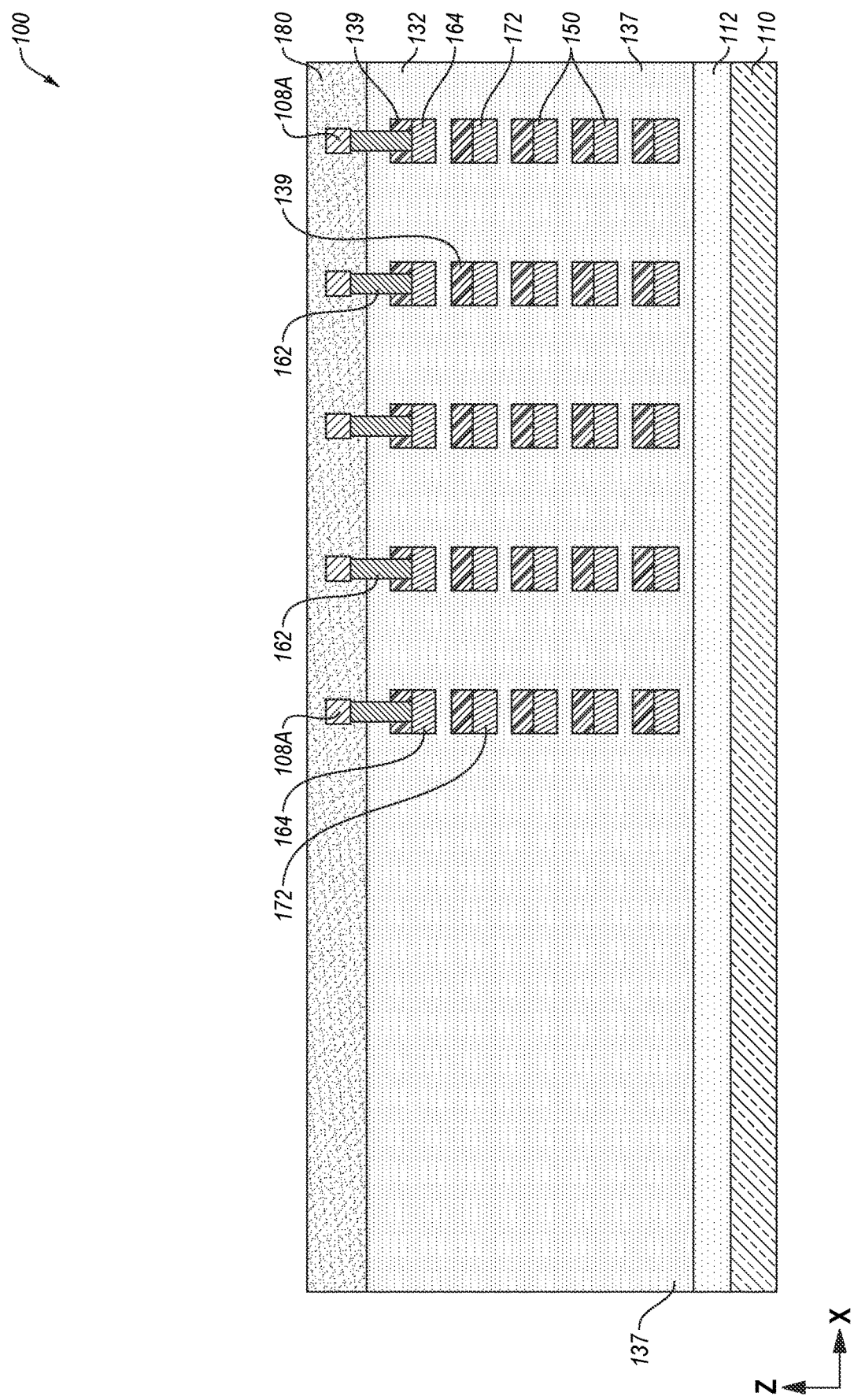
Figure 1E:
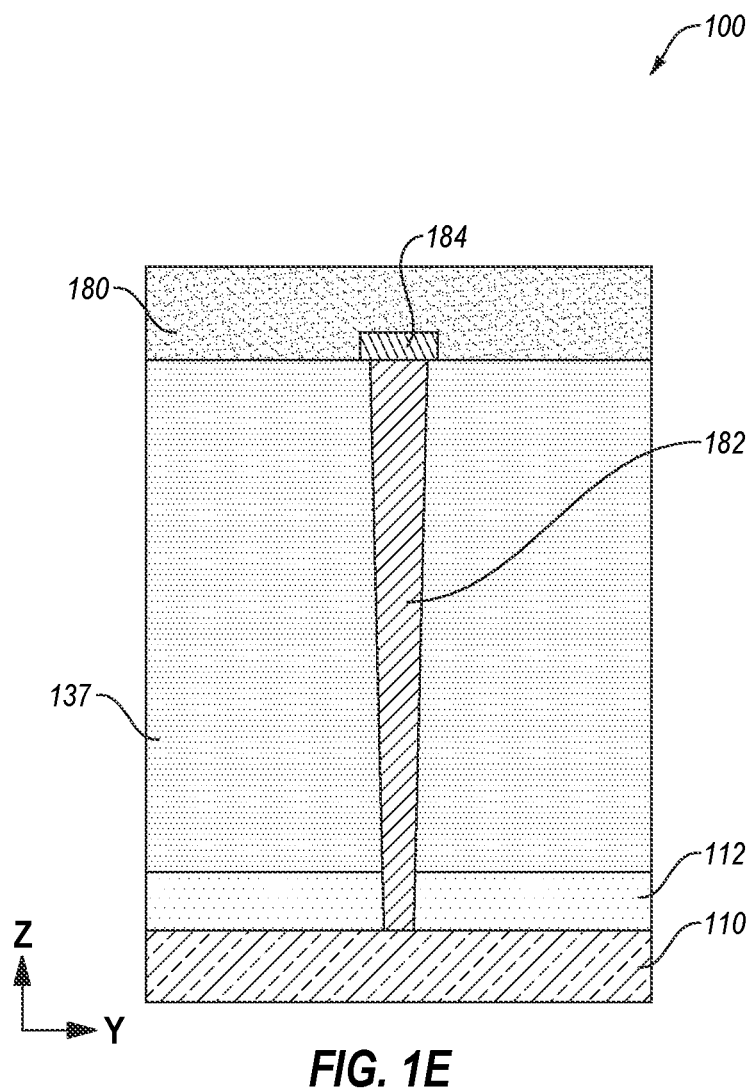

FIG. 1A is a simplified partial top-down view of the first microelectronic device structure 100; FIG. 1B is a simplified partial cross-sectional view of the first microelectronic device structure 100 taken through section line B-B of FIG. 1A; FIG. 1C is a simplified partial cross-sectional view of the first microelectronic device structure 100 taken through section line C-C of FIG. 1A; FIG. 1D is a simplified partial cross-sectional view of the first microelectronic device structure 100 taken through section line D-D of FIG. 1A; and FIG. 1E is a simplified partial cross-sectional view of the first microelectronic device structure 100 taken through section line E-E of FIG. 1A.

Referring to FIG. 1A, the first microelectronic device structure 100 includes a first array region 101 (also referred to herein as a "first memory array region") and one or more peripheral regions 103 located external to the first array region 101. In some embodiments, the peripheral regions 103 horizontally (e.g., in at least X-direction) surround the first array region 101. In some embodiments, the peripheral regions 103 substantially surround all horizontal sides of the first array region 101 in a first horizontal direction (e.g., the X-direction). In other embodiments, the peripheral regions 103 substantially surround all horizontal boundaries (e.g., an entire horizontal area) of the first array region 101.

The peripheral region 103 may include, for example, socket regions 104 including one or more first conductive interconnect structures 182 (FIG. 1A, FIG. 1E) for forming electrical connections between the first microelectronic device structure 100 and an additional microelectronic device structure (e.g., third microelectronic device structure 300 FIG. 3A through FIG. 3D). In some embodiments, at least some of the socket regions 104 may individually be horizontally neighbored (e.g., in the Y-direction) by a first conductive contact exit region 102.

The socket regions 104 may electrically connect circuitry of the first microelectronic device structure 100 to BEOL structures of an additional microelectronic device structure (e.g., the third microelectronic device structure 300 (FIG. 3A)), to input/output devices, or both.

The first conductive contact exit regions 102 may horizontally neighbor (e.g., in the Y-direction) the socket regions 104 and horizontally neighbor (e.g., in the X-direction) the first array region 101. In other embodiments, the first conductive contact exit regions 102 may not be horizontally neighbored (e.g., in the Y-direction) by any of the socket regions 104. In some such embodiments, the first conductive contact exit regions 102 may horizontally extend (e.g., in the Y-direction) substantially an entire length (e.g., in the Y-direction) of the first microelectronic device structure 100.

The first conductive contact exit regions 102 may be formed to include first conductive contact structures 176 for electrically connecting one or more components of the first microelectronic device structure 100 to circuitry of a second microelectronic device structure (e.g., second microelectronic device structure 200 (FIG. 2A)).

In some embodiments, each of the first conductive contact exit regions 102 exhibits about the same size (e.g., horizontal area in the XY plane) as each of the other of the first conductive contact exit regions 102. In other embodiments, at least some of the first conductive contact exit region 102 have a different size than other of the first conductive contact exit regions 102. In some embodiments, first conductive contact exit regions 102 at horizontal ends (e.g., in the Y-direction) of the first microelectronic device structure 100 may have a smaller horizontal area (e.g., in the XY plane) than first conductive contact exit region 102 between horizontal ends (e.g., in the Y-direction) of the first microelectronic device structure 100.

Second conductive contact exit regions 106 may horizontally neighbor (e.g., in the X-direction) the socket regions 104 and the first conductive contact exit regions 102. In some embodiments, the second conductive contact exit regions 106 are located at horizontal ends (e.g., in the Y-direction) of the first array region 101. The second conductive contact exit regions 106 may include second conductive contact structures 190 for electrically connecting one or more components of the first microelectronic device structure 100 (e.g., global digit lines 108) to circuitry of a second microelectronic device structure (e.g., the second microelectronic device structure 200 (FIG. 2A)) or a third microelectronic device structure (e.g., the third microelectronic device structure 300 (FIG. 3A)).

Each of the second conductive contact exit regions 106 may exhibit about a same size (e.g., horizontal area in the XY plane) as the other of the second conductive contact exit regions 106. In some embodiments, one or more (e.g., each) of the second conductive contact exit regions 106 exhibits a different size than one or more of (e.g., each of) the first conductive contact exit regions 102.

With collective reference to FIG. 1A and FIG. 1B, global digit lines 108 (also referred to as "conductive lines," "global bit lines," or "bit lines") horizontally extend (e.g., in the Y-direction) through the first array region 101 and horizontally terminate in the second conductive contact exit region 106. The global digit lines 108 include first global digit lines 108A and second global digit lines 108B. The first global digit lines 108A may be referred to herein as "through global digit lines" and the second global digit lines 108B may be referred to herein as "reference global digit lines." The first global digit lines 108A and the second global digit lines 108B may collectively be referred to herein as "global digit lines." In some embodiments, the first global digit lines 108A are located on a first horizontal end (e.g., in the Y-direction) of the first microelectronic device structure 100 and the second global digit lines 108B are located on a second horizontal end (e.g., in the Y-direction) of the first microelectronic device structure 100 opposite the first horizontal end. For example, in the view illustrated in FIG. 1A, the first global digit lines 108A may be located in the upper horizontal half (e.g., in the Y-direction) of the first array region 101 and the second global digit lines 108B may be located in a lower horizontal half (e.g., in the Y-direction) of the first array region 101.

Each of the global digit lines 108 and the second conductive contact structures 190 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 108 and the second conductive contact structures 190 individually comprise tungsten. In other embodiments, the global digit lines 108 and the second conductive contact structures 190 individually comprise copper.

With reference to FIG. 1A and FIG. 1B, within the first array region 101, the first microelectronic device structure 100 includes vertical (e.g., in the Z-direction) stacks of memory cells 120 over a first base structure 110. Each vertical stack of memory cells 120 comprises a vertical stack of access devices 130 and a vertical stack of storage devices 150, the storage devices 150 of the vertical stack of storage devices 150 coupled to the access devices 130 of the vertical stack of access devices 130. The vertical stacks of memory cells 120 may individually include vertically spaced (e.g., in the Z-direction) levels of memory cells 120, each memory cell 120 individually comprising a storage device 150 horizontally neighboring an access device 130. Although FIG. 1A illustrates forty (40) vertical stacks of memory cells 120 (e.g., five (5) rows and eight (8) columns of the vertical stacks of memory cells 120), the disclosure is not so limited, and the first array region 101 may include greater than forty vertical stacks of memory cells 120.

The first base structure 110 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 110 comprises a silicon wafer.

In some embodiments, the first base structure 110 includes different layers, structures, devices, and/or regions formed therein and/or thereon. In some embodiments, the first base structure 110 does not include complementary metal-oxide-semiconductor (CMOS) circuitry and devices configured for effectuating operation of the vertical stacks of memory cells 120 of the first microelectronic device structure 100. By way of non-limiting example, the first base structure 110 may not include sense amplifier devices (also referred to as "sense amplifiers" herein), sub word line driver devices, column select devices, or row select devices configured for effectuating operation of the memory cells 120 of the first microelectronic device structure 100. In some embodiments, the first base structure 110 is substantially free of control logic devices and is substantially free of CMOS circuitry and devices.

Referring now to FIG. 1B, the first base structure 110 may be electrically isolated from the vertical stacks of memory cells 120 by a first insulative material 112 vertically intervening (e.g., in the Z-direction) between the first base structure 110 and the vertical stacks of memory cells 120. The first insulative material 112 may be formed of and include insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 112 comprises silicon dioxide.

As described above, each vertical stack of memory cells 120 comprises a vertical stack of access devices 130 and a vertical stack of storage devices 150. Each of the access devices 130 may individually be operably coupled to a conductive structure 132 (FIG. 1A through FIG. 1C) of a stack structure 135 (FIG. 1C) comprising levels of the conductive structures 132 (also referred to herein as "first conductive lines," "access lines," or "word lines") vertically (e.g., in the Z-direction) spaced from one another by one or more insulative structures 137.

The access devices 130 may each individually comprise a channel material 134 between a source material 136 and a drain material 138. The channel material 134 may be horizontally (e.g., in the X-direction) between the source material 136 and the drain material 138. The source material 136 and the drain material 138 may each individually comprise a semiconductive material (e.g., polysilicon) doped with at least one N-type dopant, such as one or more of arsenic ions, phosphorous ions, and antimony ions. In other embodiments, the source material 136 and the drain material 138 each individually comprise a semiconductive material doped with at least one P-type dopant, such as boron ions.

In some embodiments, the channel material 134 comprises a semiconductive material (e.g., polysilicon) doped with at least one N-type dopant or at least one P-type dopant. In some embodiments, the channel material 134 is doped with one of at least one N-type dopant and at least one P-type dopant and each of the source material 136 and the drain material 138 are each individually doped with the other of the at least one N-type dopant and the at least one P-type dopant.

With collective reference to FIG. 1A and FIG. 1C, the conductive structures 132 may extend horizontally (e.g., in the X-direction) through the vertical stacks of memory cells 120 as lines and may each be configured to be operably coupled to a vertically (e.g., in the Z-direction) neighboring channel material 134 of the vertically neighboring (e.g., in the Z-direction) access devices 130. In other words, a conductive structure 132 may be configured to be operably coupled to a vertically neighboring access device 130.

The conductive structures 132 may be configured to provide sufficient voltage to a channel region (e.g., channel material 134) of each of the access devices 130 to electrically couple a horizontally neighboring (e.g., in the Y-direction) and associated storage device 150 to, for example, a conductive pillar structure (e.g., conductive pillar structure 160) vertically extending (e.g., in the Z-direction) through the vertical stack of access devices 130 of the vertical stack of memory cells 120. The stack structure 135 including the vertically spaced conductive structures 132 may intersect the vertical stacks of memory cells 120, such as the vertical stacks of the access devices 130 of the vertical stacks of memory cells 120, each of the conductive structures 132 of the stack structure 135 intersecting a level (e.g., a tier) of the memory cells 120 of the vertical stack of memory cells 120. With reference to FIG. 1A, each stack structure 135 individually extends through several vertical stacks of access devices 130 of the vertical stack of memory cells 120. In some embodiments, each stack structure 135 extends through horizontally neighboring (e.g., in the X-direction) vertical stacks of memory cells 120. In some embodiments, the stack structures 135 extending in a first horizontal direction (e.g., in the X-direction) are spaced from each other in a second horizontal direction (e.g., in the Y-direction).

Although FIG. 1A and FIG. 1B illustrate that the conductive structures 132 of the stack structure 135 individually intersect five (5) and form portions of the vertical stacks of memory cells 120, the disclosure is not so limited. In other embodiments, conductive structures 132 of the stack structure 135 individually intersect and form portions of fewer than five (5) of the vertical stacks of memory cells 120, such as four (4) of the vertical stacks of the memory cells 120. In other embodiments, conductive structures of the stack structure 135 individually intersect and form portions of more than five (5) of the vertical stacks of the memory cells 120, such as more than six (6) of the vertical stacks of memory cells 120, more than eight (8) of the vertical stacks of memory cells 120, more than ten (10) of the vertical stacks of the memory cells 120, more than twelve (12) of the vertical stacks of the memory cells 120, more than sixteen (16) of the vertical stacks of the memory cells 120, or more than twenty (20) of the vertical stacks of the memory cells 120.

The conductive structures 132 may individually be formed of and include conductive material, such as one or more of the materials described above with reference to the global digit lines 108. In some embodiments, the conductive structures 132 are individually formed of and include tungsten. In other embodiments, the conductive structures 132 are individually formed of and include copper.

Referring to FIG. 1B, the channel material 134 may be separated from the conductive structures 132 by a dielectric material 140, which may also be referred to herein as a "gate dielectric material." The dielectric material 140 may be formed of and include insulative material. By way of non-limiting example, the dielectric material 140 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN))), or a dielectric carboxynitride material (e.g., silicon carboxynitride (SiOCN)). In other embodiments, the channel material 134 directly contacts a vertically neighboring conductive structure 132.

In some embodiments, insulative structures 137 and additional insulative structures 139 vertically (e.g., in the Z-direction) intervene between vertically neighboring access devices 130 and vertically neighboring storage devices 150. The additional insulative structures 139 may horizontally (e.g., in the Y-direction) neighbor each of the conductive structures 132. With reference to FIG. 1C, the levels of the conductive structures 132 vertically alternate with the levels of the insulative structures 137. For clarity and ease of understanding the description, in FIG. 1C, the levels of the insulative structures 137 are illustrated as comprising an integral structure. In other embodiments, the levels of the insulative structures 137 may exhibit distinct boundaries at interfaces of the levels of the conductive structures 132.

The insulative structures 137 may individually be formed of and include insulative material. In some embodiments, the insulative structures 137 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 137 comprise silicon dioxide. Each of the insulative structures 137 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 137 exhibits a substantially homogeneous distribution of insulative material. In additional embodiments, at least one of the insulative structures 137 exhibits a substantially heterogeneous distribution of at least one insulative material. The insulative structures 137 may, for example, be formed of and include a stack (e.g., laminate) of at least two different insulative materials. The insulative structures 137 may each be substantially planar, and may each individually exhibit a desired thickness.

The additional insulative structures 139 may be formed of and include an insulative material that is different than, and that has an etch selectivity with respect to, the insulative structures 137. In some embodiments, the additional insulative structures 139 are formed of and include a nitride material (e.g., silicon nitride ($Si_3N_4$)) or an oxynitride material (e.g., silicon oxynitride). In some embodiments, the additional insulative structures 139 comprise silicon nitride. In other embodiments, the additional insulative structures 139 comprise substantially the same material composition as the insulative structures 137. In some embodiments, the additional insulative structures 139 comprise silicon dioxide.

In some embodiments, the storage devices 150 are in electrical communication with a conductive structure 142 (not illustrated in FIG. 1A for clarity and ease of understanding the description). The conductive structure 142 may be formed of and include conductive material, such as one or more of the materials of an electrode (e.g., a second electrode 154) of the storage devices 150. In some embodiments, the conductive structure 142 comprises substantially the same material composition as an electrode of the storage devices 150. In other embodiments, the conductive structure 142 comprises a different material composition than the electrodes of the storage devices 150. The conductive structures 142 may be referred to herein as "conductive plates" or "ground structures."

With continued reference to FIG. 1B, one of the storage devices 150 is illustrated in enlarged box 155. In some embodiments, each of the storage devices 150 individually comprises a first electrode 152 (also referred to herein as an "outer electrode," "a first electrode plate," or a "first node structure"), a second electrode 154 (also referred to herein as an "inner electrode," "a second electrode plate," or a "second node structure"), and a dielectric material 156 between the first electrode 152 and the second electrode 154. In some such embodiments, the storage devices 150 individually comprise capacitors. However, the disclosure is not so limited and in other embodiments, the storage devices 150 may each individually comprise other structures, such as, for example, phase change memory (PCM), resistance random-access memory (RRAM), conductive-bridging random-access memory (conductive bridging RAM), or another structure for storing a logic state.

The first electrode 152 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode 152 comprises titanium nitride.

The second electrode 154 may be formed of and include conductive material. In some embodiments, the second electrode 154 comprises one or more of the materials described above with reference to the first electrode 152. In some embodiments, the second electrode 154 comprises substantially the same material composition as the first electrode 152.

The dielectric material 156 may be formed of and include one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-k dielectric material.

The second electrode 154 may be in electrical communication with one of the conductive structures 142 of a vertical stack of memory cells 120. In some embodiments, the conductive structures 142 are individually formed of conductive material, such as one or more of the materials of the second electrode 154. In some embodiments, the conductive structures 142 comprise substantially the same material composition as the second electrode 154. In other embodiments, the conductive structures 142 comprise a different material composition than the second electrode 154.

With continued reference to FIG. 1A and FIG. 1B, the first microelectronic device structure 100 may include conductive pillar structures 160 vertically (e.g., in the Z-direction) extending through the first microelectronic device structure 100. The conductive pillar structures 160 may also be referred to herein as "digit lines," "second conductive lines," "digit line pillar structures," "local digit lines," or "vertical digit lines." The conductive pillar structures 160 may be electrically coupled to the access devices 130 to facilitate operation of the memory cells 120 of a vertical stack of memory cells 120. Stated another way, each conductive pillar structure 160 vertically extends through access devices 130 of a vertical stack of memory cells 120. In some embodiments, each vertical stack of memory cells 120 includes one of the conductive pillar structures vertically extending (e.g., in the Z-direction) the vertical stack of memory cells 120 (e.g., through the vertical stack of access devices 130 of the memory cells 120).

In some, the conductive pillar structures 160 in horizontally neighboring (e.g., in the Y-direction) stack structures 135 are horizontally aligned (e.g., in the X-direction) with each other. In other embodiments, conductive pillar structures 160 in horizontally neighboring (e.g., in the Y-direction) stack structures 135 are horizontally aligned (e.g., in the X-direction) with each other.

The conductive pillar structures 160 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 160 comprise tungsten.

With reference still to FIG. 1B, in some embodiments, each global digit line 108 (FIG. 1A, FIG. 1B) may be in electrical communication with one or more global digit line contact structures 162 that are, in turn, individually in electrical communication with a conductive structure 164 to selectively couple the respective global digit line 108 to one of the conductive pillar structures 160 through a multiplexer 166, illustrated in box 168. In some embodiments, the multiplexers 166 may facilitate selective provision of a voltage to a conductive pillar structure 160 to which it is electrically connected (by means of the global digit line contact structure 162) and selective provision of a voltage of one of the conductive pillar structures 160 to the global digit line 108 through the multiplexer 166. In other words, the global digit lines 108 are configured to be selectively electrically connected to the conductive pillar structures 160 by means of the multiplexers 166. Accordingly, the global digit lines 108 are configured to be selectively electrically connected to each conductive pillar structure 160 vertically extending (e.g., in the Z-direction) through a vertical stack of memory cells 120 by applying a voltage to the multiplexer 166 electrically connecting the global digit line 108 to the particular conductive pillar structure 160 by means of the global digit line contact structure 162 and the conductive structures 164 between the global digit line 108 and the multiplexer 166 associated with the particular conductive pillar structure. The multiplexers 166 may be driven by a multiplexer driver and/or a multiplexer control logic device operably coupled to the conductive structure 132 to which the multiplexer 166 is coupled (e.g., the conductive structure 132 vertically above (e.g., in the Z-direction) the multiplexer 166). For example, and as described in further detail herein, the multiplexers 166 may be coupled to one or more structures (e.g., transistor structures) within a multiplexer controller region of, for example, the first base structure 110. In some embodiments, the multiplexers 166 are individually configured to receive a signal (e.g., a select signal) from a multiplexer controller region and provide the signal to a bit line (e.g., conductive pillar structures 160 (FIG. 1B)) to selectively access desired memory cells within the first array region 101 for effectuating one or more control operations of the memory cells 120.

Each global digit line 108 may be configured to be selectively coupled to more than one of the conductive pillar structures 160 by means of the multiplexers 166 coupled to each of the conductive pillar structures 160. In some embodiments, each global digit line 108 is configured to selectively be in electrical communication with four (4) of the conductive pillar structures 160. In other embodiments, each of the global digit lines 108 is configured to selectively be in electrical communication with eight (8) of the conductive pillar structures 160 or sixteen (16) of the conductive pillar structures 160. One of the multiplexers 166 may be located between (e.g., horizontally between) a conductive pillar structure 160 and a horizontally neighboring conductive structure 164 that is, in turn, in electrical communication with a global digit line 108 by means of a global digit line contact structure 162.

In some embodiments, the global digit line contact structures 162 and the conductive structures 164 individually comprise a conductive material, such as a material exhibiting a relatively low resistance value to facilitate an increased speed (e.g., low RC delay) of data transmission. In some embodiments, the global digit line contact structures 162 and the conductive structures 164 individually comprise copper. In other embodiments, the global digit line contact structures 162 and the conductive structures 164 individually comprise tungsten. In yet other embodiments, the global digit line contact structures 162 and the conductive structures 164 individually comprise titanium nitride.

The global digit lines 108 and at least a portion of each of the global digit line contact structures 162 may be formed within a second insulative material 180 vertically (e.g., in the Z-direction) overlying the vertical stacks of memory cells 120. The second insulative material 180 may be formed of and include one or more of the materials described above with reference to the first insulative material 112. In some embodiments, the second insulative material 180 comprises substantially the same material composition as the first insulative material 112. In some embodiments, the second insulative material 180 comprises silicon dioxide.

In some embodiments, an access device 130 vertically (e.g., in the Z-direction) neighboring (e.g., vertically above) the multiplexer 166 may comprise a transistor 170, one of which is illustrated in box 171, configured to electrically couple a horizontally neighboring (e.g., in the X-direction) conductive pillar structure 160 to the conductive structure 142 through an additional conductive structure 172. The transistor 170 may comprise a so-called "bleeder" transistor or a "leaker" transistor configured to provide a bias voltage to the conductive pillar structures 160 to which it is coupled (e.g., the horizontally neighboring (e.g., in the X-direction) conductive pillar structures 160). In some embodiments, the conductive structure 132 coupled to the transistors 170 may be in electrical communication with a voltage, such as a drain voltage $V_{dd}$ or a voltage source supply $V_{ss}$. In use and operation, the transistors 170 are configured to provide a negative voltage to the conductive pillar structures 160 of unselected (e.g., inactive) vertical stacks of memory cells 120. In other words, the transistors 170 are configured to electrically connect unselected conductive pillar structures 160 with their respective conductive structures 142 (e.g., ground structures, cell plates), which may be coupled to a negative voltage. In some embodiments, each vertical stack of memory cells 120 includes at least one (e.g., one) of the multiplexers 166 and at least one (e.g., one) of the transistors 170.

The additional conductive structure 172 may comprise one or more of the conductive materials described above with reference to the conductive structures 164. In some embodiments, the additional conductive structure 172 comprises substantially the same material composition as the conductive structure 164. In some embodiments, the additional conductive structure 172 comprises copper. In other embodiments, the additional conductive structure 172 comprises tungsten. In yet other embodiments, the additional conductive structure 172 comprises titanium nitride.

With reference to FIG. 1B and FIG. 1C, in some embodiments, the global digit lines 108 may be located vertically above (e.g., in the Z-direction) the stack structures 135 and the vertical stacks of memory cells 120. In some embodiments, the global digit lines 108 are vertically spaced from the first base structure 110 a greater vertical distance than the vertical stacks of memory cells 120.

With reference to FIG. 1A and FIG. 1C, the conductive structures 132 of the stack structure 135 may horizontally (e.g., in the X-direction) terminate at staircase structures 174 located at horizontally (e.g., in the X-direction) terminal portions of the stack structure 135. While the staircase structures 174 are illustrated in FIG. 1A, it will be understood that the staircase structures 174 are located beneath a vertically upper (e.g., in the Z-direction) surface of the first microelectronic device structure 100. With reference to FIG. 1C, vertically higher (e.g., in the Z-direction) conductive structures 132 may have a smaller horizontal dimension (e.g., in the X-direction) than vertically lower conductive structures 132, such that horizontal edges of the conductive structures 132 at least partially define steps 175 of the staircase structures 174. In some embodiments, the memory cells 120 of the vertical stack of memory cells 120 that are vertically higher (e.g., in the Z-direction) than other memory cells 120 comprise and are intersected by conductive structures 132 having a smaller horizontal dimension (e.g., in the X-direction) than conductive structures 132 of vertically lower memory cells 120 of the vertical stacks of memory cells 120. In some embodiments, a horizontal dimension (e.g., in the X-direction) of the conductive structures 132 of the multiplexers 166 may be less than a horizontal dimension (e.g., in the X-direction) of the conductive structures 132 of the transistors 170, which may be less than a horizontal dimension (e.g., in the X-direction) of the conductive structures 132 intersecting the memory cells 120.

The staircase structures 174 may be located within the first conductive contact exit regions 102 (FIG. 1A) of the peripheral regions 103 (FIG. 1A). With reference to FIG. 1A, in some embodiments, the staircase structures 174 of each of the stack structures 135 are horizontally aligned in a first direction (e.g., in the X-direction) and horizontally offset in a second direction (e.g., the Y-direction). In some such embodiments, the staircase structure 174 of each stack structure 135 may be located at a first horizontal end (e.g., in the X-direction) of the first microelectronic device structure 100.

In other embodiments, the staircase structures 174 of horizontally neighboring (e.g., in the Y-direction) stack structures 135 may be located at opposing horizontal ends (e.g., in the X-direction) of the first microelectronic device structure 100. In some such embodiments, every other stack structure 135 includes a staircase structure 174 at a first horizontal end (e.g., in the X-direction) of the first microelectronic device structure 100 while the other of the stack structures 135 individually include a staircase structure 174 at a second horizontal end (e.g., in the X-direction) of the first microelectronic device structure 100 opposite the first horizontal end. Stated another way, the staircase structures 174 of horizontally neighboring (e.g., in the Y-direction) stack structures 135 may alternate between a first horizontal end (e.g., in the X-direction) of the first microelectronic device structure 100 and a second horizontal end (e.g., in the X-direction) of the first microelectronic device structure 100, the second horizontal end opposing the first horizontal end.

Although FIG. 1A illustrates one staircase structure 174 for every stack structure 135 (e.g., a staircase structure 174 at one horizontal end (e.g., in the X-direction) of each stack structure 135), the disclosure is not so limited. In other embodiments, the stack structures 135 may include one staircase structure 174 at each horizontal end (e.g., in the X-direction) of the stack structure 135. In some such embodiments, each of the stack structures 135 individually includes two (2) staircase structures 174.

The quantity of the steps 175 may correspond to the quantity of the levels of memory cells 120 of the vertical stack (minus one level for the multiplexers 166 and one level for the transistors 170). Although FIG. 1A and FIG. 1C illustrate that the staircase structures 174 individually comprise a particular number (e.g., five (5)) steps 175, the disclosure is not so limited. In other embodiments, the staircase structures 174 each individually include a desired quantity of the steps 175, such as within a range from thirty-two (32) of the steps 175 to two hundred fifty-six (256) of the steps 175. In some embodiments, the staircase structures 174 each individually include sixty-four (64) of the steps 175. In other embodiments, the staircase structures 174 each individually include ninety-six (96) or more of the steps 175. In some such embodiments, each vertical stack of memory cells 120 of the first microelectronic device structure 100 individually includes a corresponding quantity of memory cells 120 (e.g., minus one memory cell 120 for the multiplexer 166 and one memory cell 120 for the transistor 170). In other embodiments, the staircase structures 174 each individually include a different number of the steps 175, such as less than sixty-four (64) of the steps 175 (e.g., less than or equal to sixty (60) of the steps 175, less than or equal to fifty (50) of the steps 175, less than about forty (40) of the steps 175, less than or equal to thirty (30) of the steps 175, less than or equal to twenty (20) of the steps 175, less than or equal to ten (10) of the steps 175); or greater than sixty-four (64) of the steps 175 (e.g., greater than or equal to seventy (70) of the steps 175, greater than or equal to one hundred (100) of the steps 175, greater than or equal to about one hundred twenty-eight (128) of the steps 175, greater than two hundred fifty-six (256) of the steps 175).

With continued reference to FIG. 1A and FIG. 1C, first conductive contact structures 176 may be in electrical communication with individual conductive structures 132 at the steps 175. For example, the first conductive contact structures 176 may individually physically contact (e.g., land on) portions of upper surfaces of the conductive structures 132 at least partially defining treads of the steps 175. In some embodiments, each step 175 may be in electrical communication with a first conductive contact structure 176 at the horizontal (e.g., in the X-direction) end of the staircase structure 174. In other embodiments, every other step 175 of the staircase structures 174 may include a first conductive contact structure 176 in contact therewith. In other words, every other step 175 of the staircase structures 174 may individually be in contact with a first conductive contact structure 176. In some such embodiments, each stack structure 135 may include one staircase structure 174 at each horizontal (e.g., in the X-direction) end thereof and each step 175 of a first staircase structure 174 at a first horizontal end of the stack structure 135 not in electrical communication with a first conductive contact structure 176 may individually be in electrical communication with a first conductive contact structure 176 at a second staircase structure 174 at a second, opposite horizontal end of the stack structure 135.

The first conductive contact structures 176 may individually be formed of and include conductive material, such as one or more of the materials described above with reference to the conductive pillar structures 160. In some embodiments, the first conductive contact structures 176 comprise substantially the same material composition as the conductive pillar structures 160. In other embodiments, the first conductive contact structures 176 comprise a different material composition than the conductive pillar structures 160. In some embodiments, the first conductive contact structures 176 comprise tungsten.

First pad structures 178 may vertically overlie and individually be in electrical communication with of the first conductive contact structures 176. Each of the first conductive contact structures 176 is individually in electrical communication with one of the first pad structures 178. The first pad structure 178 may be formed within the second insulative material 180.

The first pad structures 178 are individually formed of and include conductive material, such as one or more of the materials described above with reference to the global digit lines 108. In some embodiments, the first pad structures 178 are formed of and include tungsten. In other embodiments, the first pad structures 178 are formed of and include copper.

FIG. 1D is a simplified partial cross-sectional view of the first microelectronic device structure 100 taken through section line D-D of FIG. 1A and horizontally spaced (e.g., in the Y-direction) from the cross-sectional view of FIG. 1C. The cross-section of FIG. 1D is taken through the storage devices 150 and does not illustrate the access devices 130 (FIG. 1C) or the conductive structures 132 (FIG. 1A, FIG. 1C).

With reference to FIG. 1E, one or more first conductive interconnect structures 182 vertically extend (e.g., in the Z-direction) through the insulative structures 137 and the first insulative material 112 to contact the first base structure 110. In some embodiments, the socket region 104 includes one or more of the first conductive interconnect structures 182.

The first conductive interconnect structures 182 may individually be formed of and include conductive material, such as, for example, one or more of the materials described above with reference to the global digit lines 108. In some embodiments, the first conductive interconnect structures 182 individually comprise tungsten.

Second pad structures 184 may individually vertically overlie and individually be in electrical communication with individual first conductive interconnect structures 182. The second pad structures 184 may be located within the second insulative material 180.

The second pad structures 184 may be formed of and include conductive material, such as one or more of the materials of the first pad structures 178. In some embodiments, the second pad structures 184 individually comprise substantially the same material composition as the first pad structures 178. In some embodiments, the second pad structures 184 are formed of and include tungsten. In other embodiments, the second pad structures 184 are formed of and include copper.

With collective reference to FIG. 1B through FIG. 1E, the second insulative material 180 vertically overlies the first microelectronic device structure 100. As described in further detail herein, the second insulative material 180 may facilitate attaching (e.g., bonding) the first microelectronic device structure 100 to a second microelectronic device structure (e.g., the second microelectronic device structure 200 (FIG. 2A)).

Figure 2A:
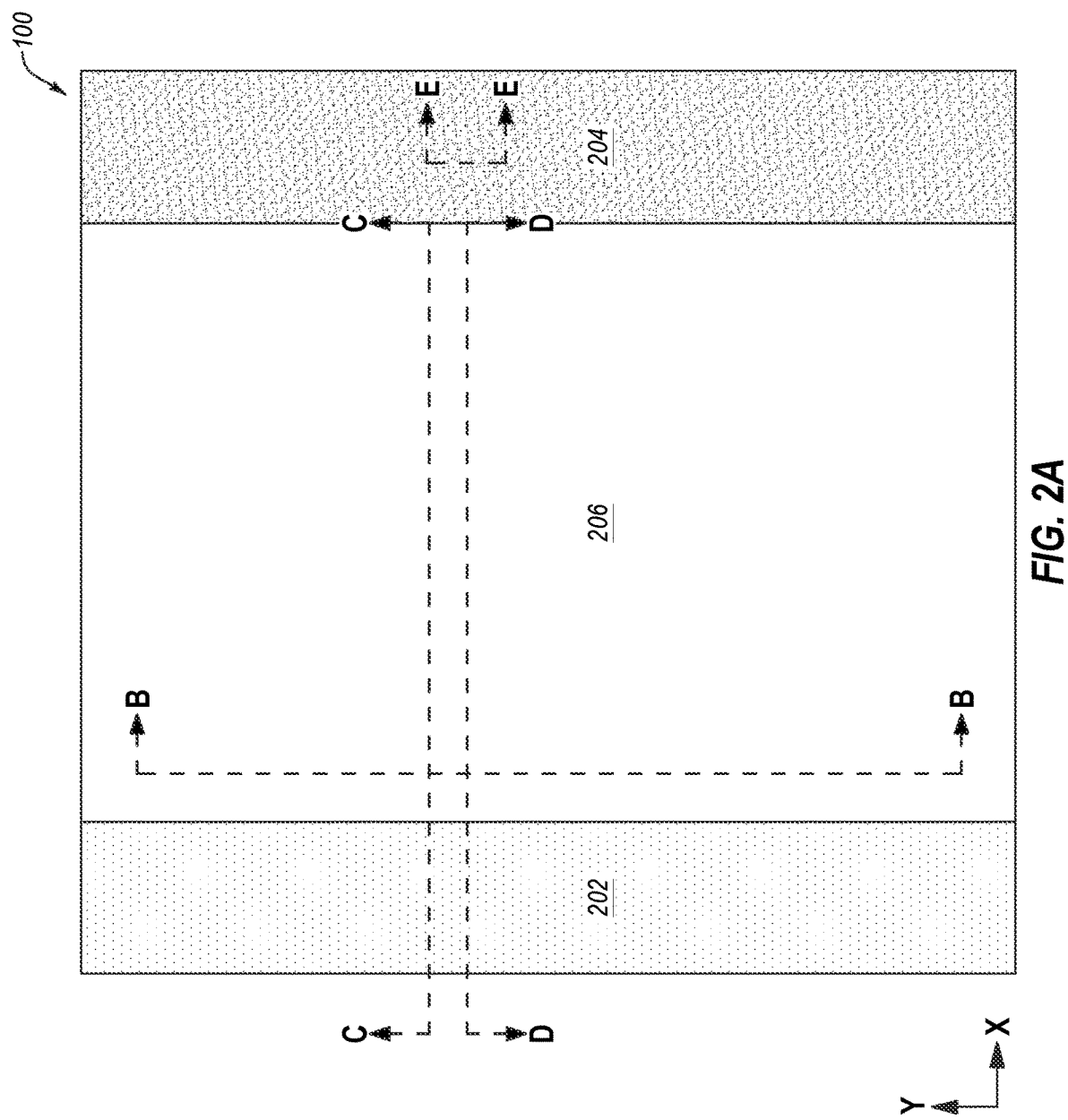
Figure 2B:
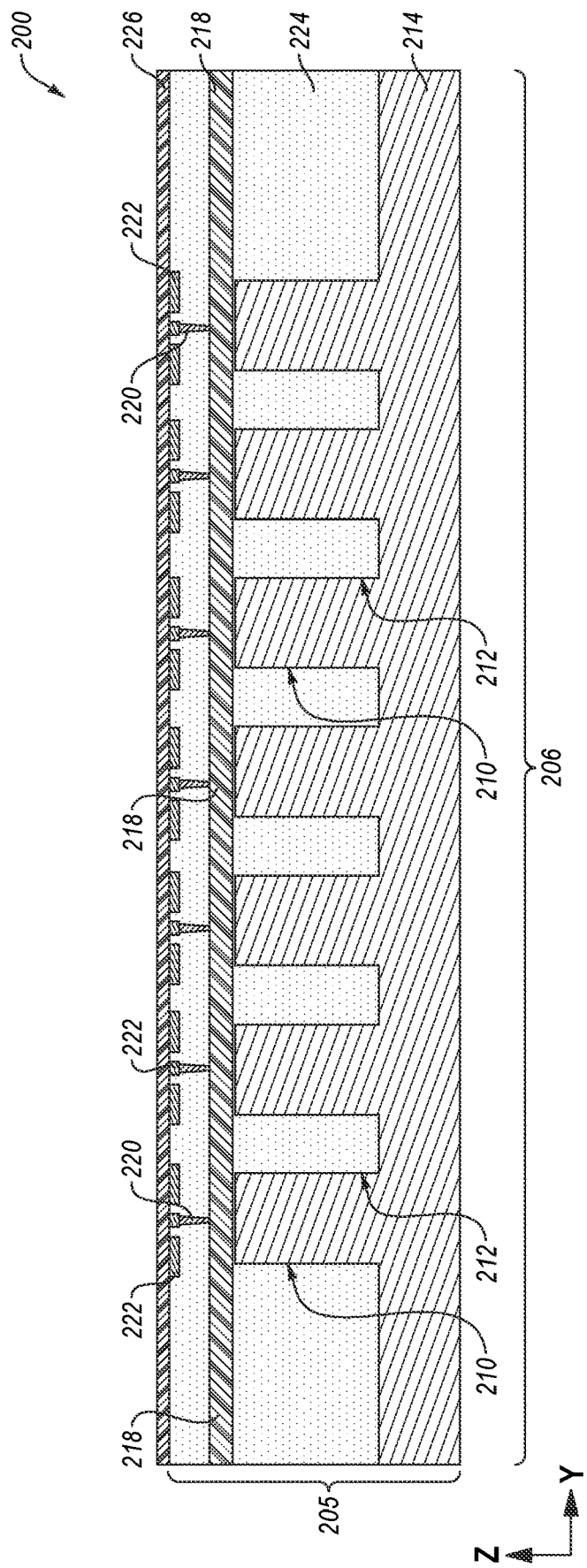
Figure 2C:
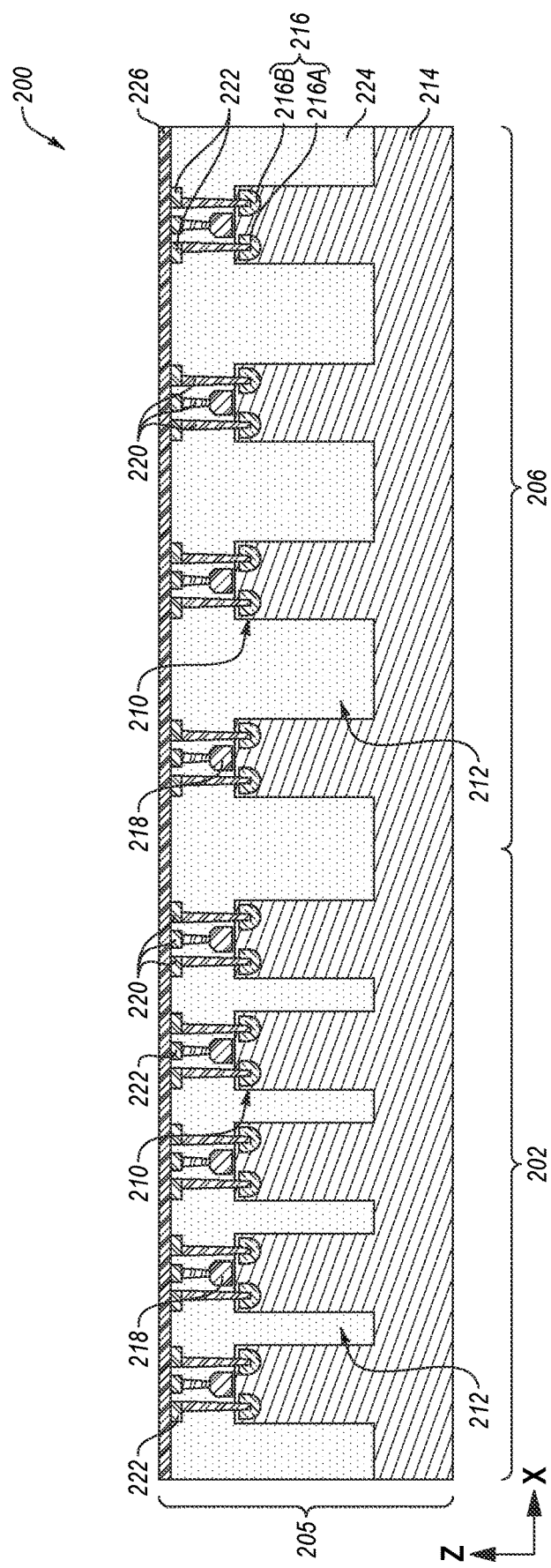
Figure 2D:
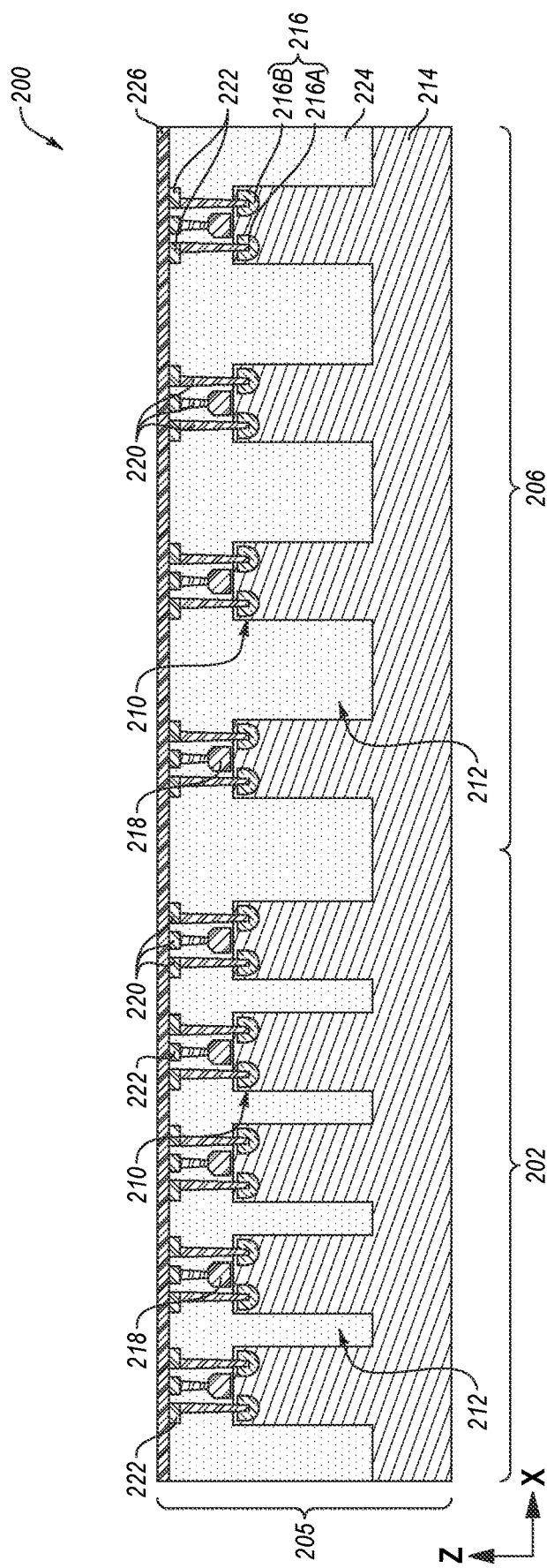
Figure 2E:
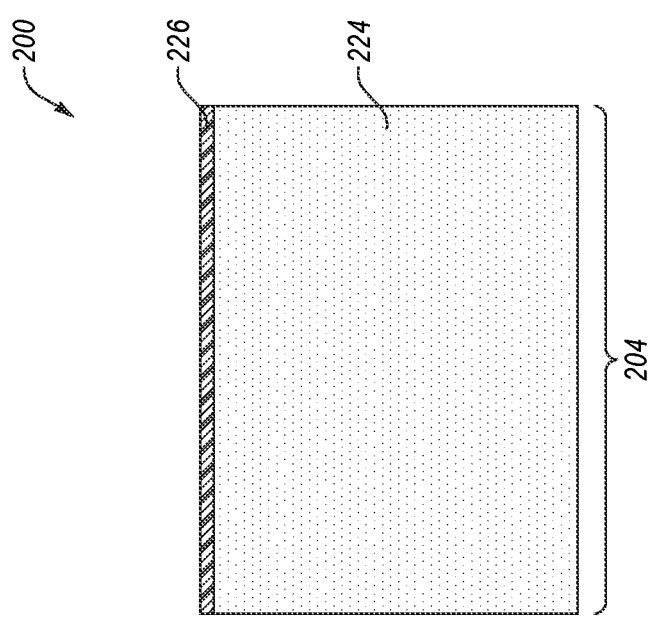
Figure 2E:
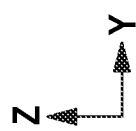

FIG. 2A is a simplified partial top-down view of a second microelectronic device structure 200; FIG. 2B is a simplified partial cross-sectional view of the second microelectronic device structure 200 taken through section line B-B of FIG. 2A; FIG. 2C is a simplified partial cross-sectional view of the second microelectronic device structure 200 taken through section line C-C of FIG. 2A; FIG. 2D is a simplified partial cross-sectional view of the second microelectronic device structure 200 taken through section line D-D of FIG. 2A; and FIG. 2E is a simplified partial cross-sectional view of the second microelectronic device structure 200 taken through section line E-E of FIG. 2A. With reference to FIG. 2A, in some embodiments, the second microelectronic device structure 200 exhibits substantially the same horizontal cross-sectional area as the first microelectronic device structure 100 (FIG. 1A). The second microelectronic device structure 200 may also be referred to herein as a second die or a second wafer.

The second microelectronic device structure 200 may include one or more control logic devices (e.g., CMOS devices) and circuitry. With reference to FIG. 2A, the second microelectronic device structure 200 may include one or more sub word line driver regions 202, one or more socket regions 204, and one or more additional CMOS regions 206 including one or more of (e.g., all of) one or more sense amplifier devices (e.g., equalization (EQ) amplifiers, isolation (ISO) amplifiers, NMOS sense amplifiers (NSAs), PMOS sense amplifiers (PSAs)), column decoders, multiplexer control logic devices, sense amplifier drivers, main word line driver devices, row decoder devices, and row select devices. The one or more socket regions 204 may be formed to include one or more interconnect devices to electrically connect the socket regions 104 (FIG. 1A) of the first microelectronic device structure 100 (FIG. 1A) to one or more devices of a third microelectronic device structure (e.g., third microelectronic device structure 300 (FIG. 3A)).

The one or more sub word line driver regions 202 may be configured to be electrically coupled to the memory cells 120 (FIG. 1B) of the first microelectronic device structure 100 (FIG. 1B). The one or more sub word line driver regions 202 may be configured to be vertically above (e.g., in the Z-direction) (e.g., directly vertically above) and within horizontal boundaries of the first conductive contact exit regions 102 of the first microelectronic device structure 100, such as within horizontal boundaries of the staircase structures 174 (FIG. 1A, FIG. 1C).

In some embodiments, as described in further detail below, the sub word line driver regions 202 may include sub word line driver devices including transistor structures that are electrically coupled to the first pad structures 178 (FIG. 1C) in electrical communication with the first conductive contact structures 176 (FIG. 1C), that are, in turn, electrically coupled to one of the conductive structures 132. Each sub word line driver of the sub word line driver regions 202 may be, in turn, electrically coupled to a main word line driver by electrical connections. In some embodiments, the main word line drivers are located within the sub word line driver regions 202 and are horizontally offset (e.g., in the Y-direction) from the sub word line drivers. In other embodiments, the main word line drivers are located within the additional CMOS regions 206 and are horizontally offset (e.g., in the X-direction) from the sub word line drivers.

The main word line driver devices may be coupled to row decoder devices. The row decoder devices may be configured to receive an address signal from, for example, an address decoder and send a signal to a horizontally neighboring main word line driver. In some embodiments, the row decoder devices are located within the additional CMOS regions 206 and are horizontally offset (e.g., in the X-direction, in the Y-direction) from the main word line driver devices. In other embodiments, the row decoder devices are located within the sub word line driver regions 202.

The sense amplifier devices of the additional CMOS region 206 may include, for example, one or more of equalization (EQ) amplifiers, isolation (ISO) amplifiers, NMOS sense amplifiers (NSAs) (also referred to as N sense amplifiers), and PMOS sense amplifiers (PSAs) (also referred to as P sense amplifiers).

As described in further detail below, the additional CMOS region 206 is configured to be vertically above (e.g., in the Z-direction) (e.g., directly vertically above) and within horizontal boundaries of the second conductive contact exit regions 106 of the first microelectronic device structure 100 such that sense amplifiers of the additional CMOS region 206 are vertically above (e.g., in the Z-direction) (e.g., directly vertically above) the global digit lines 108. In some embodiments, the sense amplifier devices of the additional CMOS region 206 are electrically coupled to the second conductive contact structures 190 (FIG. 1A) without horizontally (e.g., in the X-direction, in the Y-direction) rerouting (e.g., by way of intervening, conductive routing structures) the second conductive contact structures 190 to electrically connect the sense amplifiers of the additional CMOS region 206 to the global digit lines 108.

In some embodiments, the one or more additional CMOS regions 206 comprises one or more column decoder devices. The column decoder devices are individually in electrical communication with one or more components of a horizontally neighboring (e.g., in the X-direction, in the Y-direction) sense amplifier device region of the additional CMOS region 206. The column decoder devices may each individually be configured to receive an address signal from, for example, an address decoder and send a signal to a horizontally neighboring sense amplifier of the additional CMOS region 206.

The additional CMOS region 206 may further include sense amplifier drivers (also referred to as "sense amplifier driver devices") horizontally neighboring (e.g., in the X-direction, in the Y-direction) the sense amplifiers of the additional CMOS region 206. The sense amplifier drivers may be electrically coupled to the sense amplifiers by way of conductive structures.

The sense amplifier drivers of the additional CMOS region 206 may include NMOS sense amplifier drivers (RNL) and PMOS sense amplifier drivers (ACT). The NMOS sense amplifier drivers may generate, for example, activation signals for driving the NMOS sense amplifiers of the sense amplifiers of the additional CMOS region 206 and the PMOS sense amplifier drivers may generate, for example, activation signals for driving the PMOS sense amplifiers of the sense amplifiers of the additional CMOS region 206. By way of non-limiting example, NMOS sense amplifier drivers generate a low potential (e.g., ground) activation signal for activating an NMOS sense amplifier of the sense amplifiers and the PMOS sense amplifier drivers generate a high potential (e.g., $V_{cc}$) activation signal for activating a PMOS sense amplifier of the sense amplifiers. However, the disclosure is not so limited and the NMOS sense amplifier drivers and the PMOS sense amplifier drivers may generate sense amplifier activation signals other than those described.

In some embodiments, the additional CMOS region 206 includes multiplexer control logic devices configured for effectuating operation of the multiplexers 166 (FIG. 1B). In some embodiments, the conductive structures 132 (FIG. 1B) associated with the multiplexers 166 may be in electrical communication with circuitry of the multiplexer control logic devices for selectively electrically coupling a conductive pillar structure 160 (FIG. 1B) associated with a multiplexer 166 to a global digit line 108 (FIG. 1B).

The cross-sectional view of FIG. 2B illustrates the additional CMOS region 206, the cross-sectional view of FIG. 2C illustrates the sub word line driver region 202, and the additional CMOS region 206; and the cross-sectional view of FIG. 2D illustrates the sub word line driver region 202 and the additional CMOS region 206. With collective reference to FIG. 2B through FIG. 2D, the second microelectronic device structure 200 includes a first control logic device region 205 including the sub word line driver region 202 and the additional CMOS region 206.

Each of the sub word line driver region 202 and the additional CMOS region 206 individually include transistor structure 210 for forming the control logic devices of the sub word line driver region 202 (e.g., sub word line drivers and, optionally, main word line drivers and row decoders) and control logic devices of the additional CMOS region 206 (e.g., sense amplifiers, column decoders, sense amplifier drivers, multiplexer control logic, and, optionally, main word line drivers and row decoders).

The transistor structures 210 may be separated from one another by isolation trenches 212 within a second base structure 214 (e.g., a second semiconductive wafer). The second base structure 214 may include a base material or construction upon which additional materials and structures of the second microelectronic device structure 200 are formed. The second base structure 214 may comprise a semiconductive structure (e.g., a semiconductive wafer), or a base semiconductive material on a supporting structure. For example, the second base structure 214 may comprise a conventional silicon substrate (e.g., a conventional silicon wafer), or another bulk substrate comprising a semiconductive material. In some embodiments, the second base structure 214 comprises a silicon wafer. In addition, the second base structure 214 may include one or more layers, structures, and/or regions formed therein and/or thereon.

The transistor structures 210 may each include conductively doped regions 216, each of which includes a source region 216A and a drain region 216B. Channel regions of the transistor structures 210 may be horizontally interposed between the conductively doped regions 216. In some embodiments, the conductively doped regions 216 of each transistor structure 210 individually comprises one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively doped regions 216 comprise conductively doped silicon.

The transistor structures 210 include gate structures 218 vertically overlying the second base structure 214 and horizontally extending between conductively doped regions 216. The gate structures 218 may be horizontally aligned (e.g., in the Y-direction) with and shared by the channel regions of multiple transistor structures 210 horizontally neighboring (e.g., in the X-direction (FIG. 2A)) one another. In some such embodiments, the gate structures 218 extend in a first horizontal direction (e.g., in the Y-direction). In addition, dielectric material (also referred to herein as a "gate dielectric material") may be vertically interposed between the gate structures 218 and portions of the second base structure 214 at least partially defining the channel regions of the transistor structures 210. The conductively doped regions 216 and the gate structures 218 may individually be electrically coupled to second conductive interconnect structures 220. The second conductive interconnect structures 220 may individually electrically couple the conductively doped regions 216 and the gate structures 218 to one or more first routing structures 222. In FIG. 2B, the conductively doped regions 216 and the second conductive interconnect structures 220 in electrical communication with the conductively doped regions 216 are not illustrated, but it will be understood, that the conductively doped regions 216 and the second conductive interconnect structures 220 are located in a plane different than that in which the gate structures 218 extend. By way of non-limiting example, each gate structure 218 may be in electrical communication with a plurality of source regions 216A on a first side of the gate structure 218 (e.g., spaced from the gate structure 218 in the X-direction) and a plurality of drain regions 216B on a second, opposite side of the gate structure 218 (e.g., spaced from the gate structure 218 in the X-direction opposite the source regions 216A). At least some of the first routing structures 222 (e.g., the first routing structures 222 not in electrical communication with the second conductive interconnect structures 220 in electrical communication with the gate structure 218) may be in electrical communication with second conductive interconnect structures 220 that are, in turn, in electrical communication with one of the source regions 216A or one of the drain regions 216B, as illustrated in FIG. 2C and FIG. 2D.

Each of the gate structures 218, the second conductive interconnect structure 220, and the first routing structures 222 may individually be formed of and include conductive material. In some embodiments, the gate structures 218, the second conductive interconnect structure 220, and the first routing structures 222 are individually formed of and include tungsten. In other embodiments, the gate structures 218, the second conductive interconnect structure 220, and the first routing structures 222 are individually formed of and include copper.

The second microelectronic device structure 200 may include a third insulative material 224 between the transistor structures 210 and electrically isolating different portions of the transistor structures 210, the second conductive interconnect structures 220, and the first routing structures 222.

The third insulative material 224 may be formed of and include one or more of the materials described above with reference to the first insulative material 112 (FIG. 1B, FIG. 1C). In some embodiments, the third insulative material 224 comprises substantially the same material composition as the first insulative material 112. In some embodiments, the third insulative material 224 comprises silicon dioxide.

A fourth insulative material 226 vertically overlies the third insulative material 224 and the first routing structures 222. The fourth insulative material 226 may be formed of and include one or more of the materials described above with reference to the third insulative material 224. In some embodiments, the fourth insulative material 226 comprises substantially the same material composition as the third insulative material 224. In some embodiments, the fourth insulative material 226 comprises a different material composition than the third insulative material 224. In some embodiments, the fourth insulative material 226 comprises silicon dioxide.

FIG. 2E is a simplified partial cross-sectional view of the second microelectronic device structure 200 taken through section line E-E of FIG. 2A. With reference to FIG. 2E, in some embodiments, the socket regions 204 include the third insulative material 224 vertically overlying (e.g., in the Z-direction) the second base structure 214; and the fourth insulative material 226 vertically overlying the third insulative material 224.

Figure 2G:
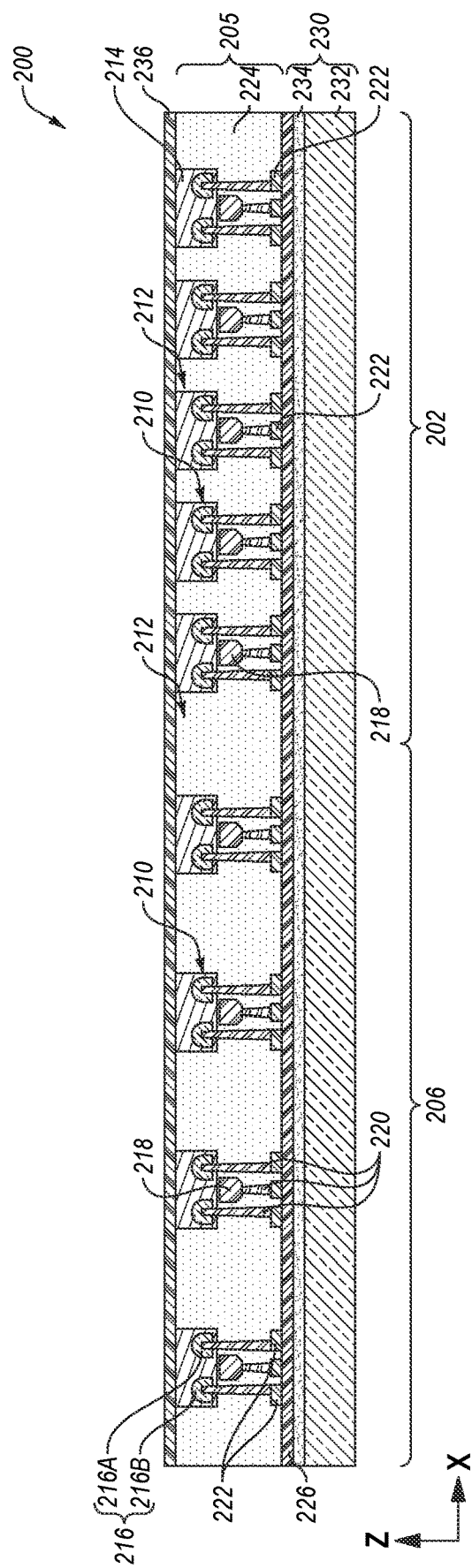
Figure 2H:
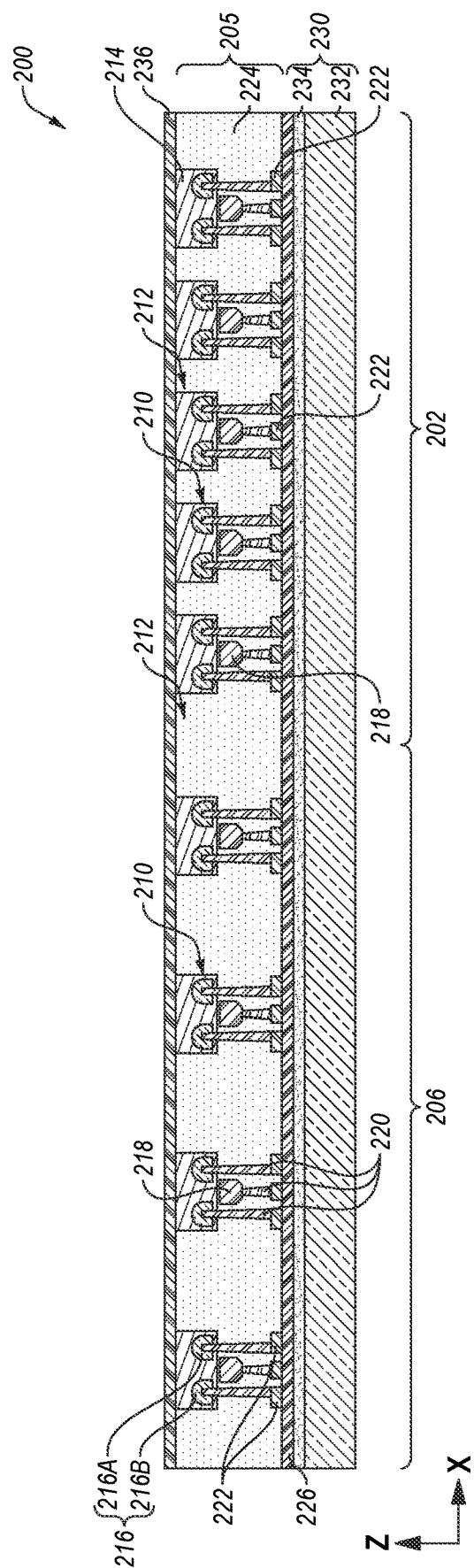
Figure 2I:
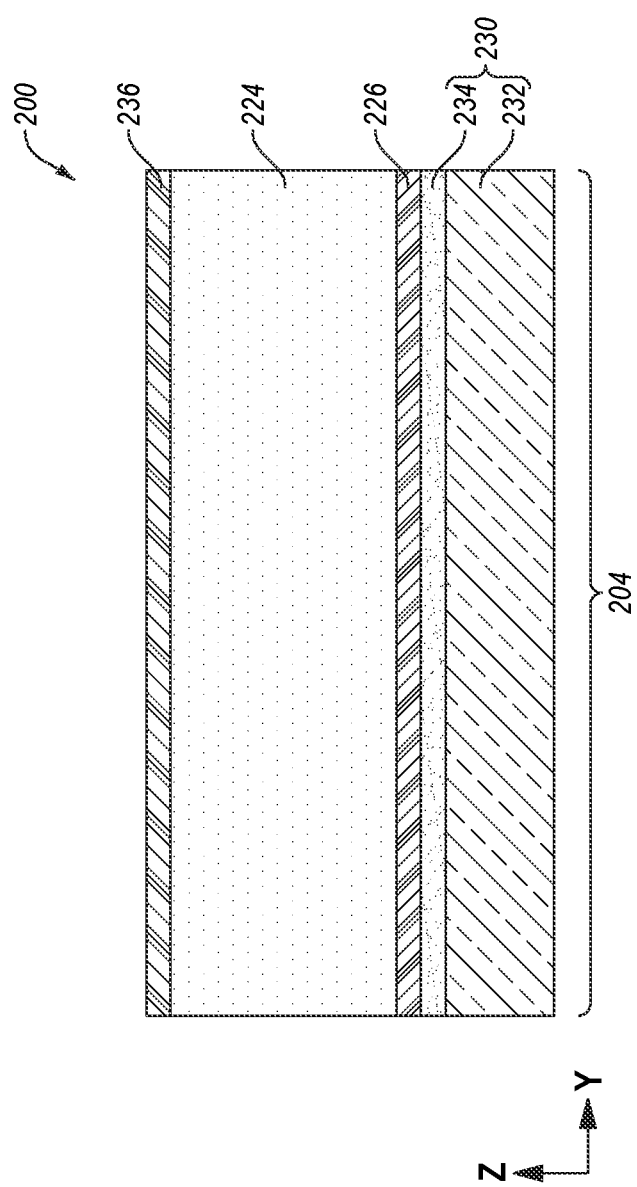

Referring now to FIG. 2F through FIG. 2I, a carrier wafer assembly 230 may be bonded to the second microelectronic device structure 200 and the second microelectronic device structure 200 may be vertically (e.g., in the Z-direction) inverted (e.g., flipped). FIG. 2F illustrates the same cross-sectional view of the second microelectronic device structure 200 illustrated in FIG. 2B; FIG. 2G illustrates the same cross-sectional view of the second microelectronic device structure 200 illustrated in FIG. 2C; FIG. 2H illustrates the same cross-sectional view of the second microelectronic device structure 200 illustrated in FIG. 2D; and FIG. 2I illustrates the same cross-sectional view of the second microelectronic device structure 200 illustrated in FIG. 2E.

The carrier wafer assembly 230 may include a wafer structure 232 and a fifth insulative material 234 over the wafer structure 232. The wafer structure 232 may comprise, for example, a glass substrate. The fifth insulative material 234 may comprise an oxide material, such as, for example, silicon dioxide. In some embodiments, the fifth insulative material 234 comprises substantially the same material composition as the fourth insulative material 226.

The carrier wafer assembly 230 may be attached to the second microelectronic device structure 200 by placing the fifth insulative material 234 in contact with the fourth insulative material 226 and exposing the second microelectronic device structure 200 and the carrier wafer assembly 230 to annealing conditions to form bonds (e.g., oxide-to-oxide bonds) between the fifth insulative material 234 in contact with the fourth insulative material 226. In some embodiments, the second microelectronic device structure 200 and the carrier wafer assembly 230 are exposed to a temperature greater than, for example, 800° C., to form the oxide-to-oxide bonds and attach the second microelectronic device structure 200 to the carrier wafer assembly 230.

After attaching the carrier wafer assembly 230 to the second microelectronic device structure 200, the second microelectronic device structure 200 may be vertically (e.g., in the Z-direction) inverted (e.g., flipped) and the second base structure 214 may be vertically (e.g., in the Z-direction) thinned by exposing the second base structure 214 to a chemical mechanical planarization (CMP) process. In other embodiments, the second base structure 214 is vertically thinned by exposing the second base structure 214 to a dry etch. Vertically thinning the second base structure 214 may electrically isolate the transistor structures 210 from one another.

After vertically thinning the second base structure 214, a sixth insulative material 236 is formed over the second microelectronic device structure 200. The sixth insulative material 236 may be formed of and include one or more of the materials described above with reference to the third insulative material 224. In some embodiments, the sixth insulative material 236 comprises silicon dioxide.

Figure 2J:
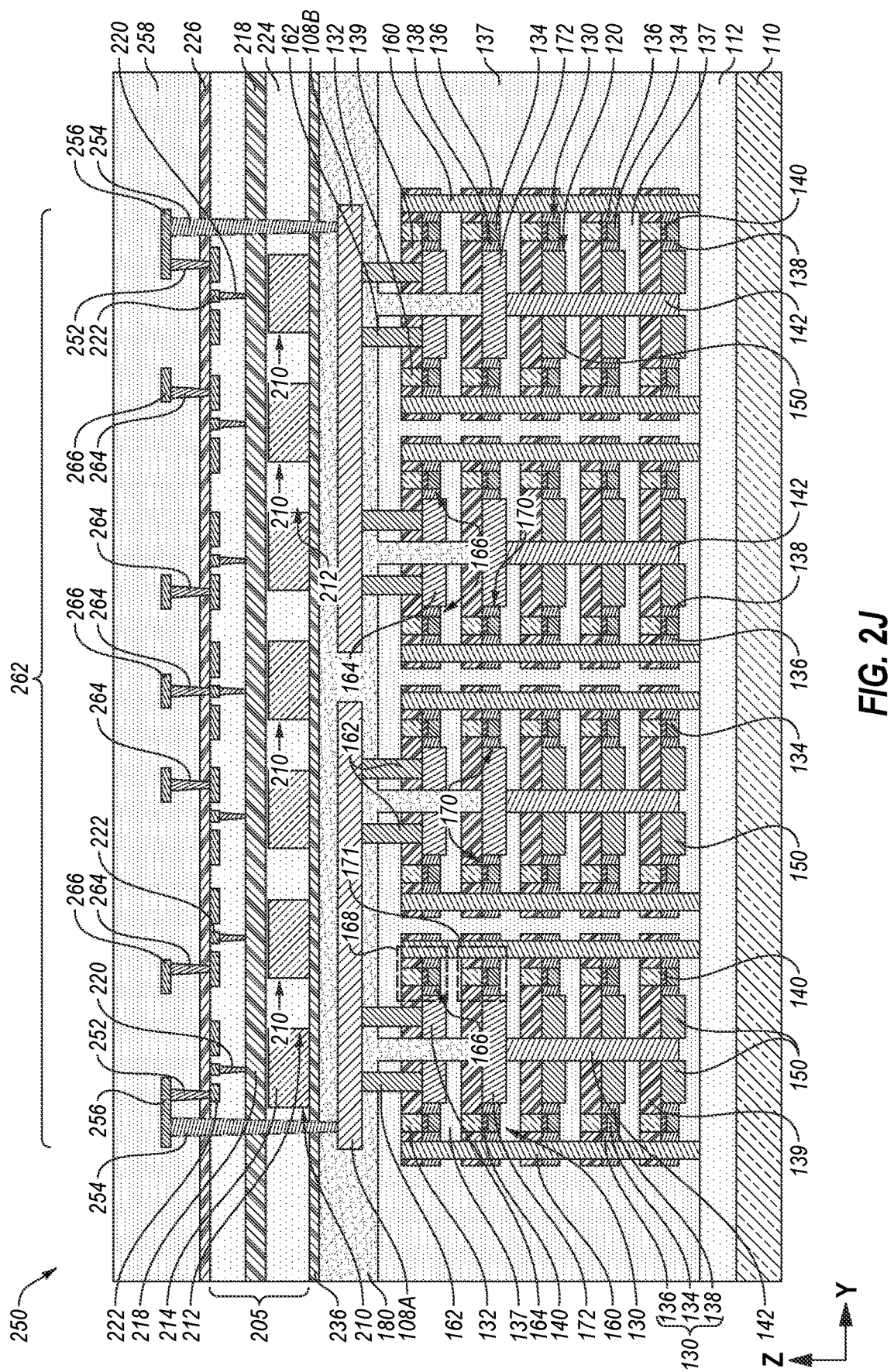
Figure 2K:
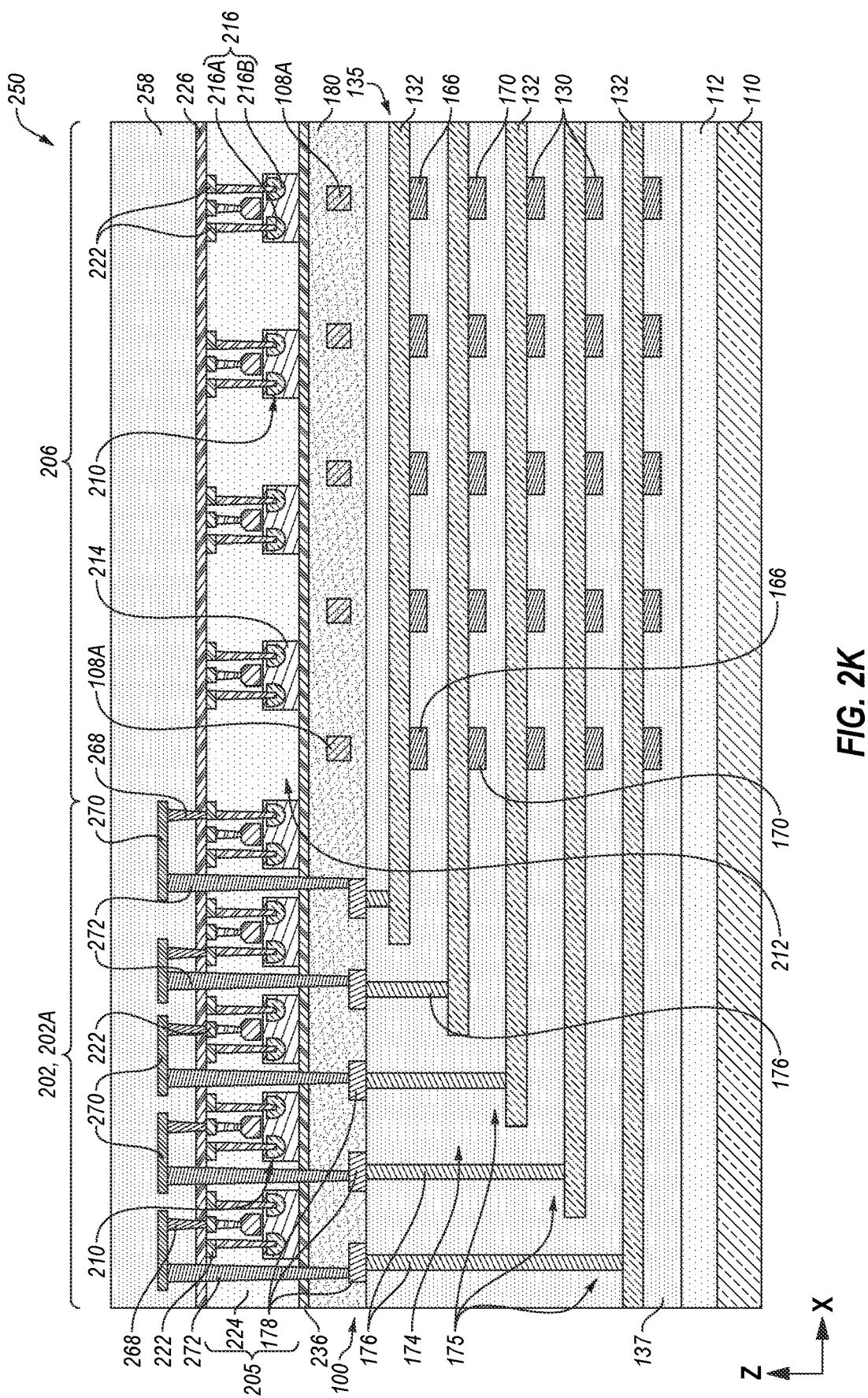
Figure 2L:
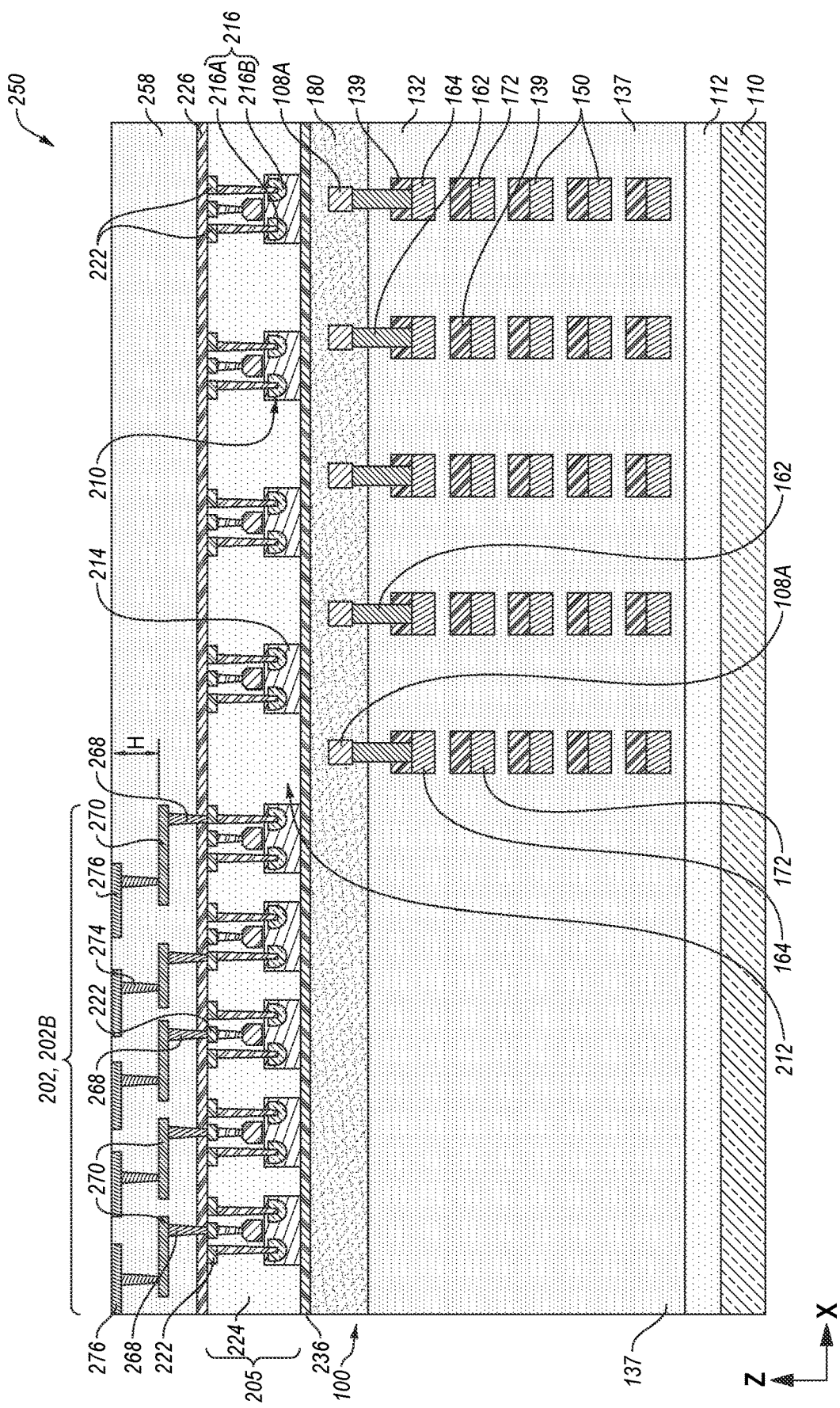
Figure 2M:
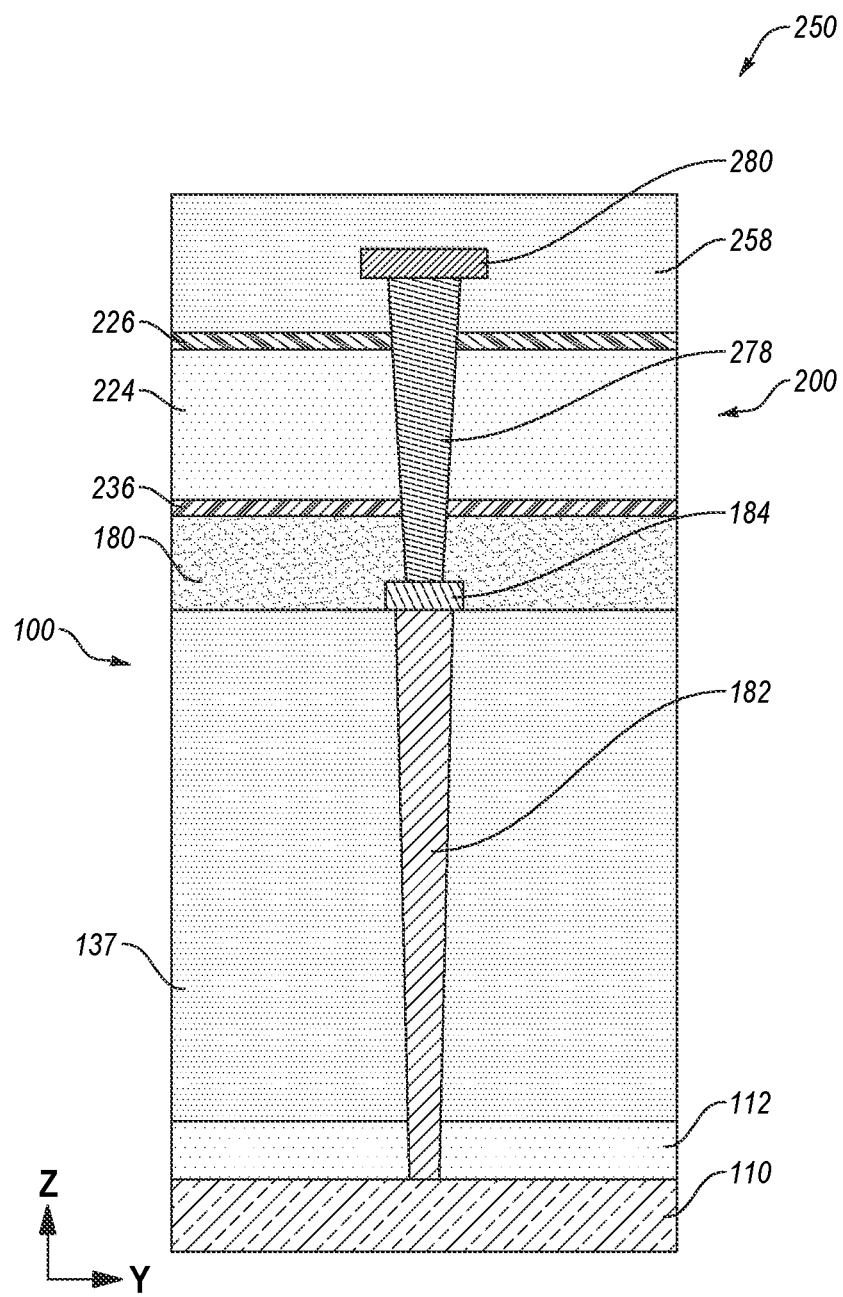

Referring now to FIG. 2J through FIG. 2M, the second microelectronic device structure 200 may be vertically (e.g., in the Z-direction) inverted (e.g., flipped) and attached to the first microelectronic device structure 100 to form a first microelectronic device structure assembly 250 comprising the first microelectronic device structure 100 and the second microelectronic device structure 200 attached to the first microelectronic device structure 100. FIG. 2J illustrates the same cross-sectional view of the first microelectronic device structure 100 and the second microelectronic device structure 200 illustrated in FIG. 1B and FIG. 2F, respectively; FIG. 2K illustrates the same cross-sectional view of the first microelectronic device structure 100 and the second microelectronic device structure 200 illustrated in FIG. 1C and FIG. 2G, respectively; FIG. 2L is a simplified partial cross-sectional view of the first microelectronic device structure 100 and the second microelectronic device structure 200 illustrated in FIG. 1D and FIG. 2H, respectively; and FIG. 2M illustrates the same cross-sectional view of the first microelectronic device structure 100 and the second microelectronic device structure 200 illustrated in FIG. 1E and FIG. 2I, respectively.

In some embodiments, the second microelectronic device structure 200 is flipped (e.g., vertically flipped), and the sixth insulative material 236 of the second microelectronic device structure 200 is bonded to the second insulative material 180 of the first microelectronic device structure 100 to attach the first microelectronic device structure 100 to the second microelectronic device structure 200 and form the first microelectronic device structure assembly 250. After attaching the second microelectronic device structure 200 to the first microelectronic device structure 100, the carrier wafer assembly 230 may be removed from the second microelectronic device structure 200.

With collective reference to FIG. 2J through FIG. 2M, after attaching the second microelectronic device structure 200 to the first microelectronic device structure 100, at least some of the transistor structures 210 of the second microelectronic device structure 200 may be electrically connected to components of the first microelectronic device structure 100. With reference to FIG. 2J, third conductive interconnect structures 252 may be formed in electrical communication with the first routing structures 222 that are, in turn, electrically coupled to the transistors structures 210 vertically overlying (e.g., in the Z-direction) the global digit lines 108 within horizontal boundaries (e.g., in the X-direction, in the Y-direction) of the vertical stacks of memory cells 120. The third conductive interconnect structures 252 may be formed vertically (e.g., in the Z-direction) through the fourth insulative material 226.

Fourth conductive interconnect structures 254 may be formed in electrical communication with the global digit lines 108 vertically underlying (e.g., in the Z-direction) the second microelectronic device structure 200. The fourth conductive interconnect structures 254 may vertically extend through the fourth insulative material 226, the third insulative material 224, the sixth insulative material 236, and the second insulative material 180. In some embodiments, the fourth conductive interconnect structures 254 are located in a different plane than the conductive structures 218 such that the fourth conductive interconnect structures 254 do not electrically short to the conductive structures 218 and are, therefore, illustrated in broken lines in the view of FIG. 2J.

In some embodiments, the fourth conductive interconnect structures 254 are electrically connected to the third conductive interconnect structures 252 by means of second routing structures 256 horizontally extending (e.g., in the Y-direction) between the fourth conductive interconnect structures 254 and the third conductive interconnect structures 252.

In some embodiments, the first control logic device region 205 comprises a first sense amplifier device region 262 including transistor structures 210 forming the sense amplifier devices of the one or more additional CMOS regions 206. In some embodiments, the transistor structures 210 of the first sense amplifier device region 262 are vertically (e.g., in the Z-direction) over the global digit lines 108 and located within horizontal boundaries (e.g., in the X-direction, in the Y-direction) of the first array region 101 (FIG. 1A), such as within horizontal boundaries of the stacks of memory cells 120. In some embodiments, the sense amplifier devices of the sense amplifier device region 262 are in electrical communication with the global digit lines 108 by means of the third conductive interconnect structures 252, the second routing structures 256, and the fourth conductive interconnect structures 254. In some embodiments, each sense amplifier device of the first sense amplifier device region 262 is in electrical communication with one of the first global digit lines 108A and one of the second global digit lines 108B. In use and operation (e.g., such as during a read operation of the memory cells 120), the sense amplifier devices of the first sense amplifier device region 262 are configured to amplify a signal (e.g., a difference in voltage) between the first global digit line 108A and the second global digit line 108B to which the sense amplifier device is connected.

In some embodiments, the first sense amplifier device region 262 further comprises transistor structures 210 forming column select devices and/or one or more additional control logic devices (e.g., row decoders, column decoders) that are in electrical communication with the sense amplifiers of the first sense amplifier device region 262, such as by means of fifth conductive interconnect structures 264 and third routing structures 266.

Each of the third conductive interconnect structures 252, the fourth conductive interconnect structures 254, and the second routing structures 256 may be formed of and include conductive material, such as one or more of the materials described above with reference to the first conductive interconnect structures 182. In some embodiments, each of the third conductive interconnect structures 252, the fourth conductive interconnect structures 254, and the second routing structures 256 are individually formed of and include tungsten. In other embodiments, each of the third conductive interconnect structures 252, the fourth conductive interconnect structures 254, and the second routing structures 256 are individually formed of and include copper.

The third conductive interconnect structures 252, the fourth conductive interconnect structures 254, and the second routing structures 256 may be formed within a seventh insulative material 258. The seventh insulative material 258 may include one or more of the materials described above with reference to the first insulative material 112. In some embodiments, the seventh insulative material 258 comprises silicon dioxide.

With continued reference to FIG. 2J, the sense amplifier devices of the first sense amplifier device region 262 may also be in electrical communication with sense amplifier driver circuitry (e.g., NMOS sense amplifier drivers (RNL) and PMOS sense amplifier drivers (ACT)) by means of the fifth conductive interconnect structures 264 and the third routing structures 266.

Each of the fifth conductive interconnect structures 264 and the third routing structures 266 are individually be formed of and include conductive material, such as one or more of the materials described above with reference to the first conductive interconnect structures 182. In some embodiments, each of the fifth conductive interconnect structures 264 and the third routing structures 266 are individually formed of and include tungsten. In other embodiments, each of the fifth conductive interconnect structures 264 and the third routing structures 266 are individually formed of and include copper.

With reference to FIG. 2K and FIG. 2L, transistors structures 210 vertically overlying (e.g., in the Z-direction) the staircase structures 174 (e.g., the steps 175 of the staircase structures 174) may be located within the sub word line driver region 202. With reference to FIG. 2K, some of the transistor structures 210 may be in electrical communication with the first pad structures 178 of the first microelectronic device structure 100 and with reference to FIG. 2L, others of the transistor structures 210 may not be in electrical communication with the first pad structures 178 of the first microelectronic device structure 100 and may be configured to be in electrical communication with pad structures of a third microelectronic device structure (e.g., third microelectronic device structure 300) to be formed vertically (e.g., in the Z-direction) over the second microelectronic device structure 200 of the first microelectronic device structure assembly 250. Accordingly, in some embodiments, the second microelectronic device structure 200 includes first sub word line driver regions 202A (FIG. 2K) including transistor structures 210 in electrical communication with the conductive structures 132 of the first microelectronic device structure 100 and second sub word line driver regions 202B (FIG. 2L) horizontally neighboring (e.g., in the Y-direction) the first sub word line driver regions 202A and configured to be in electrical communication with conductive structures of a third microelectronic device structure to be formed vertically over the second microelectronic device structure 200. In some embodiments, the first pad structures 178 in electrical communication with the conductive structures 132 connected to the multiplexers 166 and the first pad structures 178 in electrical communication with the conductive structures 132 connected to the transistors 170 are individually in electrical communication with transistor structures 210 that form a portion of a multiplexer controller.

With reference to FIG. 2K and FIG. 2L, the first sub word line driver region 202A (FIG. 2K) may be located within the horizontal boundaries (e.g., in the X-direction, in the Y-direction) of the staircase structure 174 (FIG. 2K) and the second sub word line driver regions 202B (FIG. 2L) may be horizontally spaced (e.g., in the Y-direction) from the staircase structures 174 and may not be located within horizontal boundaries (e.g., in the X-direction, in the Y-direction) of the staircase structure 174.

With continued reference to FIG. 2K and FIG. 2L, sixth conductive interconnect structures 268 may be in electrical communication with the first routing structures 222 of the transistor structures 210 within the first sub word line driver region 202A (FIG. 2K) and the transistor structures 210 within the second sub word line driver region 202B (FIG. 2L). The sixth conductive interconnect structures 268 may be in electrical communication with fourth routing structures 270.

Each of the sixth conductive interconnect structures 268 and the fourth routing structures 270 may individually be formed of and include conductive material, such as one or more of the materials described above with reference to the first conductive interconnect structures 182. In some embodiments, each of the sixth conductive interconnect structures 268 and the fourth routing structures 270 are individually formed of and include tungsten. In other embodiments, each of the sixth conductive interconnect structures 268 and the fourth routing structures 270 are individually formed of and include copper.

Referring to FIG. 2K, the fourth routing structures 270 within the first sub word line driver region 202A are in electrical communication with seventh conductive interconnect structures 272 that are, in turn, in electrical communication with the first pad structures 178 in electrical communication with the conductive structures 132 of the first microelectronic device structure 100.

Referring to FIG. 2L, the fourth routing structures 270 within the second sub word line driver region 202B are in electrical communication with eighth conductive interconnect structures 274 that are, in turn, in electrical communication with third pad structures 276. As described in further detail below, the third pad structures 276 are configured to be in electrical communication with portions of a third microelectronic device structure (e.g., the third microelectronic device structure 300) to be formed vertically over the second microelectronic device structure 200 of the first microelectronic device structure assembly 250.

Each of the eighth conductive interconnect structures 274 and the third pad structures 276 are individually formed of and include conductive material, such as one or more of the materials described above with reference to the first conductive interconnect structures 182. In some embodiments, each of the eighth conductive interconnects structures 274 and the third pad structures 276 are individually formed of and include tungsten. In other embodiments, each of the eighth conductive interconnects structures 274 and the third pad structures 276 are individually formed of and include copper.

Each of the sixth conductive interconnect structures 268, the fourth routing structures 270, the seventh conductive interconnect structures 272, the eighth conductive interconnect structures 274, and the third pad structures 276 may be formed within the seventh insulative material 258.

With continued reference to FIG. 2L, a vertical height H (e.g., in the Z-direction) between of the eighth conductive interconnect structures 274 and the third pad structures 276 may be within a range of from about 200 nm to about 500 nm, such as from about 200 nm to about 300 nm, from about 300 nm to about 400 nm, or from about 400 nm to about 500 nm.

Referring to FIG. 2M, within the socket region 204, one or more ninth conductive interconnect structures 278 may be formed through each of the seventh insulative material 258, the fourth insulative material 226, the third insulative material 224, the sixth insulative material 236, and the second insulative material 180. A fourth pad structure 280 may individually be formed vertically over (e.g., in the Z-direction) each of the ninth conductive interconnect structures 278.

Each of the ninth conductive interconnect structures 278 and the fourth pad structures 280 may individually be formed of and include conductive material, such as one or more of the materials described above with reference to the first conductive interconnect structures 182. In some embodiments, each of the ninth conductive interconnect structures 278 and the fourth pad structures 280 are individually formed of and include tungsten. In other embodiments, each of the ninth conductive interconnect structures 278 and the fourth pad structures 280 are individually formed of and include copper.

FIG. 3A through FIG. 3D are simplified partial cross-sectional views illustrating a third microelectronic device structure 300, in accordance with embodiments of the disclosure. Components of the third microelectronic device structure 300 that are similar to corresponding components of the first microelectronic device structure 100 may retain the same numerical designation, except that reference numerals 1XX are replaced with 3XX. Put another way, in FIG. 3A through FIG. 3D and the associated description, features (e.g., structures, materials, devices, regions) of the third microelectronic device structure 300 functionally similar to previously described features (e.g., structures, materials, devices, regions) of the first microelectronic device structure 100 described with reference to FIG. 1A through FIG. 1E are referred to with similar reference numerals incremented by 100. To avoid repetition, not all features shown in FIGS. 3A through 3D are described in detail herein. Rather, unless described otherwise below, in FIGS. 3A through 3D, a feature designated by a reference numeral that is a 100 increment of the reference numeral of a feature previously described with reference to one or more of FIG. 1A through FIG. 1E will be understood to be substantially similar to the previously described feature. By way of non-limiting example, unless described otherwise below, a feature designated by the reference numeral 330 in FIG. 3A will be understood to be substantially similar to one of the access devices 130 (including the channel material 134, the source material 136, and the drain material 138 thereof) previously described herein with reference to FIG. 1A and FIG. 1B. The third microelectronic device structure 300 may also be referred to herein as a third die or a third semiconductive wafer.

Figure 3A:
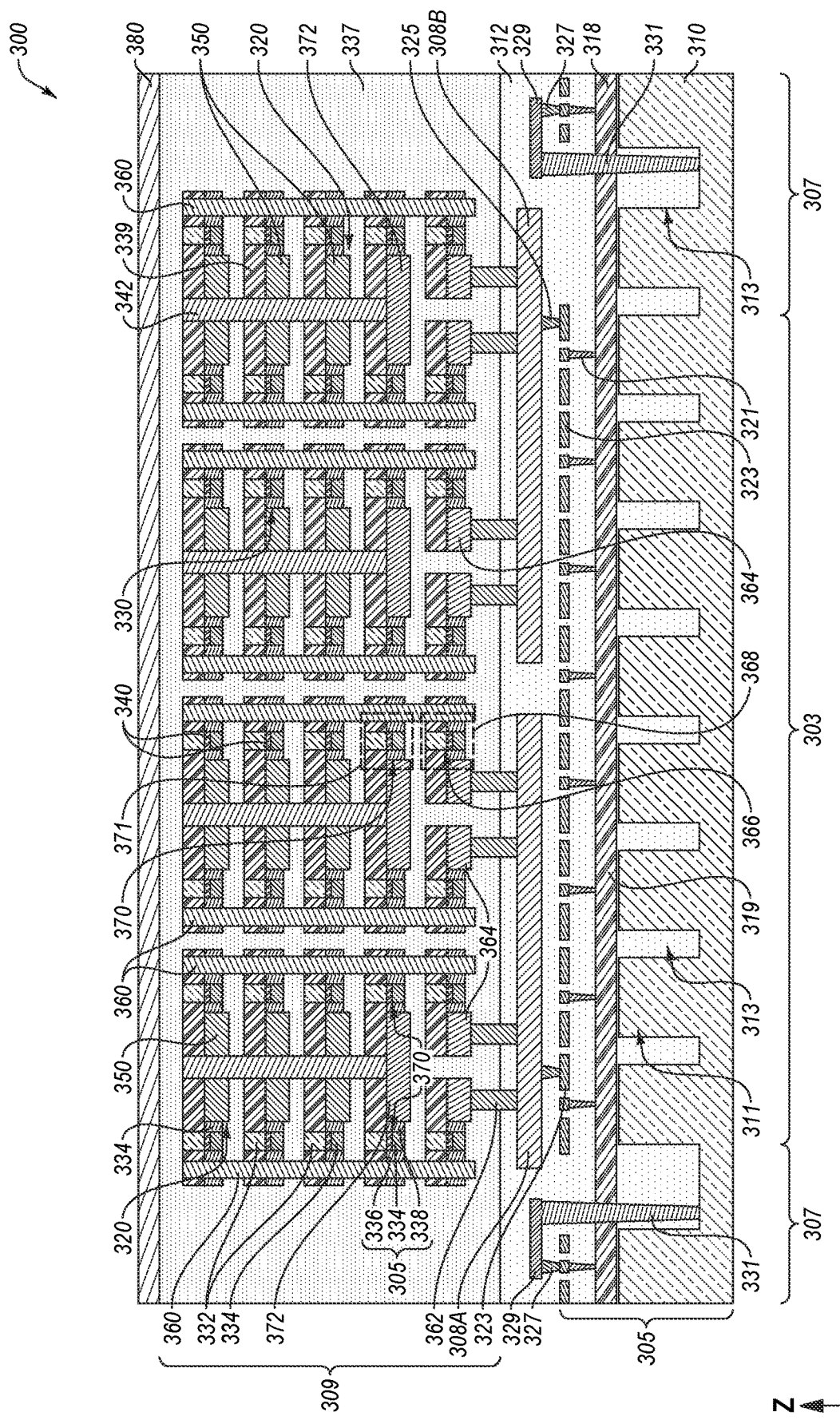
FIG. 3A through FIG. 3D include simplified partial cross-sectional views illustrating a third microelectronic device structure, in accordance with embodiments of the disclosure.

With reference to FIG. 3A, the third microelectronic device structure 300 includes a second control logic device region 305 and a second array region 309 (also referred to herein as a "second memory array region") vertically overlying (e.g., in the Z-direction) the second control logic region 305. With collective reference to FIG. 3A through FIG. 3C, the second control logic region 305 includes one or more second sense amplifier device region 303; one or more additional CMOS device regions 307 horizontally neighboring (e.g., in the Y-direction) the second sense amplifier device region 303 and/or vertically underlying (e.g., in the Z-direction) the staircase structures 374.

The second control logic region 305 includes a third base structure 310 that is substantially similar to the first base structure 110 and the second base structure 214. Transistor structures 311 substantially similar to the transistor structures 210 of the second microelectronic device structure 200 of the first microelectronic device structure assembly 250 are formed within the third base structure 310 in the second control logic region 305. Horizontally neighboring (e.g., in the X-direction, in the Y-direction) transistor structures 311 are isolated from one another by isolation trenches 313 comprising an eighth insulative material 312. The eighth insulative material is substantially the same as the first insulative material 112.

The transistor structures 311 may each individually include conductively doped regions 317, each of which includes a source region 317A and a drain region 317B. Channel regions of the transistor structures 311 may be horizontally interposed between the conductively doped regions 317. Each of the conductively doped regions 317 (including the source regions 317A and the drain regions 317B) may be substantially the same as the conductively doped regions 216, the source regions 216A, and the drain regions 216B.

Figure 3B:
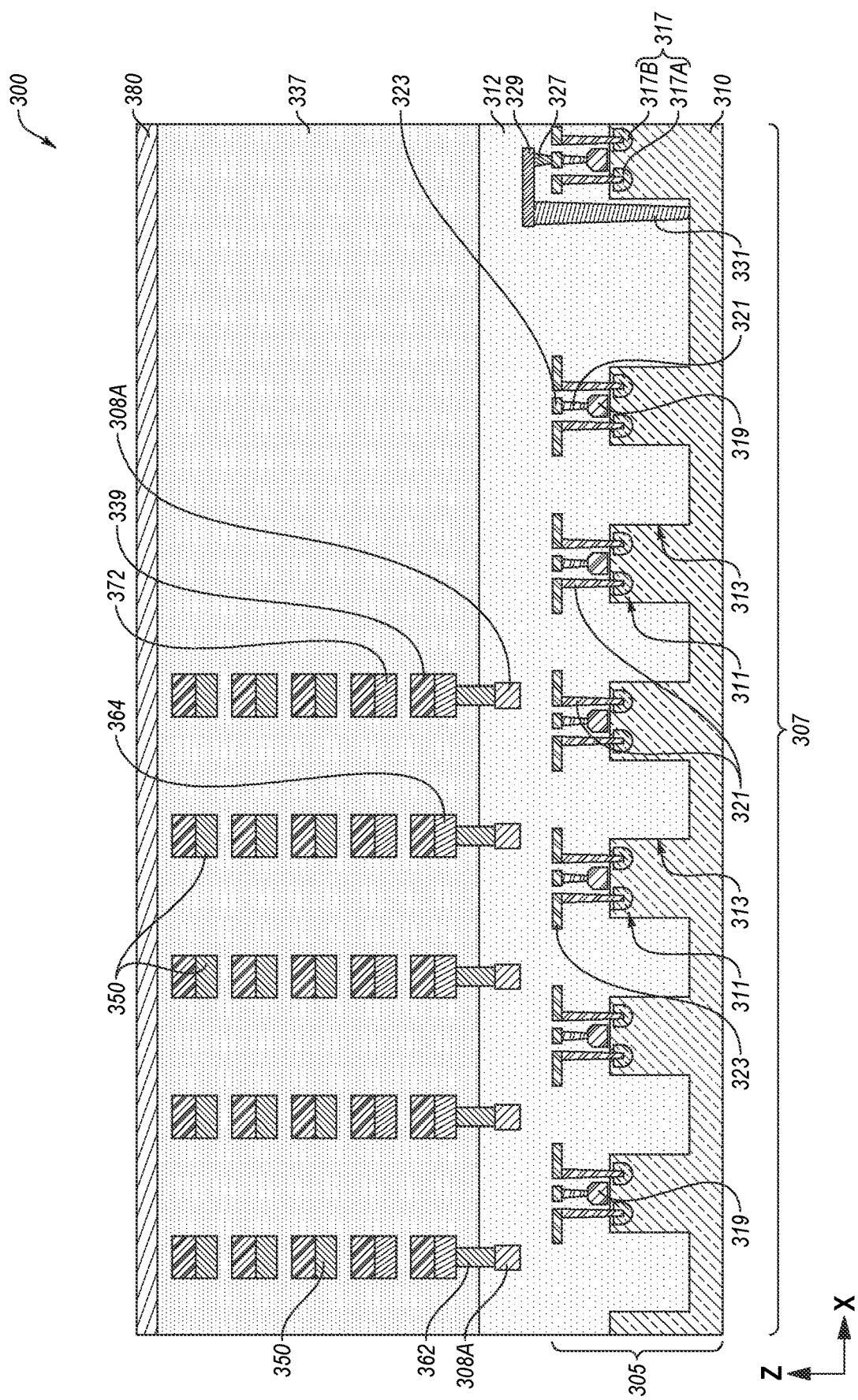
Figure 3C:
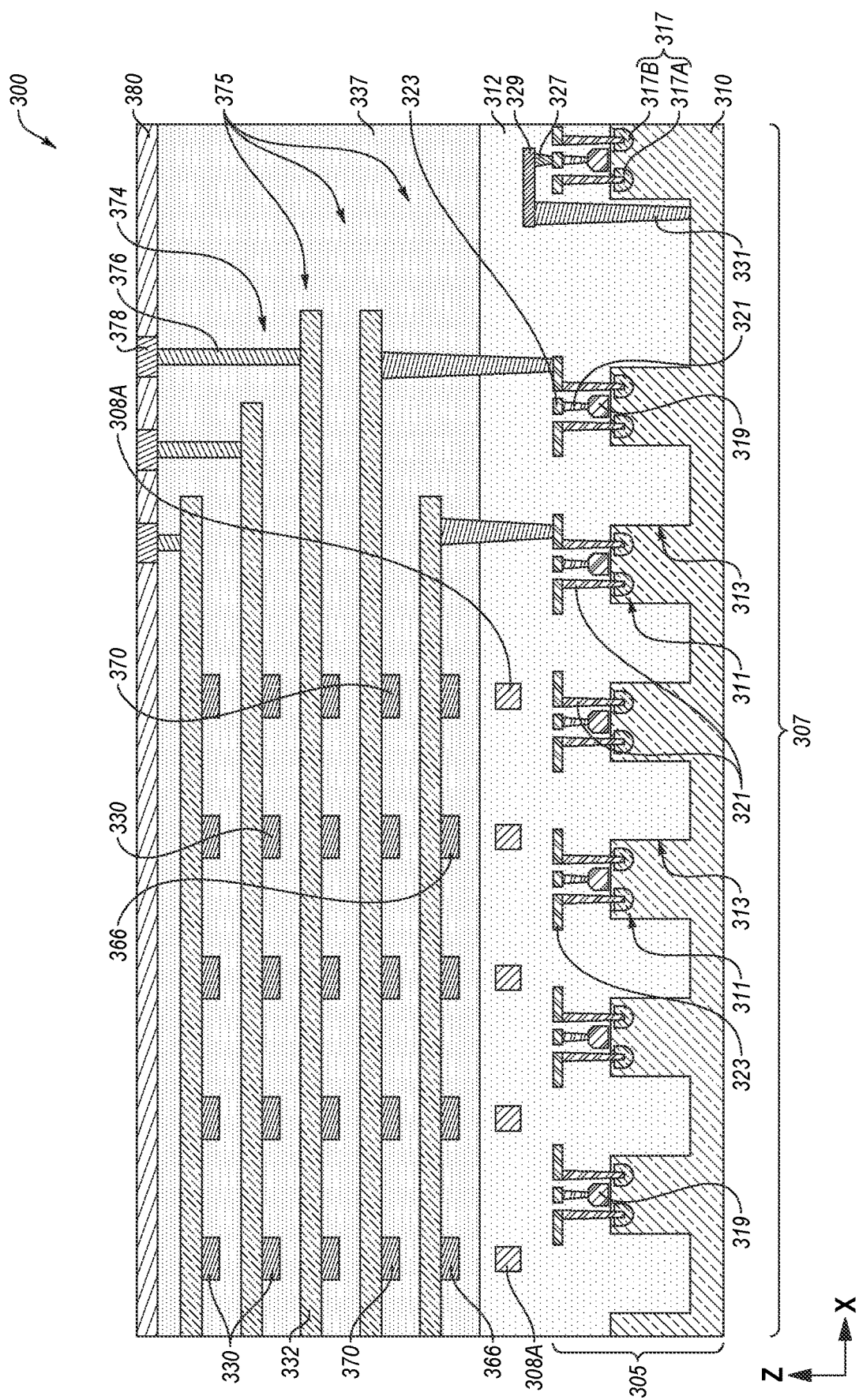

The transistor structures 311 include gate structures 319 vertically overlying (e.g., in the Z-direction) the third base structure 310 and horizontally extending between conductively doped regions 317. The gate structures 319 may be horizontally aligned (e.g., in the Y-direction) with and shared by the channel regions of multiple transistor structures 311 horizontally neighboring (e.g., in the X-direction (FIG. 3C)) one another. In some such embodiments, the gate structures 319 extend in a first horizontal direction (e.g., in the Y-direction). In addition, dielectric material (also referred to herein as a "gate dielectric material") may be vertically interposed between the gate structures 319 and portions of the third base structure 310 at least partially defining the channel regions of the transistor structures 311. The conductively doped regions 317 and the gate structures 319 may individually be electrically coupled to tenth conductive interconnect structures 321. The tenth conductive interconnect structures 321 may individually electrically couple the conductively doped regions 317 and the gate structures 319 to one or more fifth routing structures 323. In FIG. 3A, the conductively doped regions 317 and the tenth conductive interconnect structures 321 in electrical communication with the conductively doped regions 317 are not illustrated, but it will be understood that the conductively doped regions 317 and the tenth conductive interconnect structures 321 are located in a plane different than that in which the gate structures 318 extend. By way of non-limiting example, each gate structure 318 may be in electrical communication with a plurality of source regions 317A on a first side of the gate structure 318 (e.g., spaced from the gate structure 318 in the X-direction) and a plurality of drain regions 317B on a second, opposite side of the gate structure 318 (e.g., spaced from the gate structure 318 in the X-direction opposite the source regions 317A). At least some of the fifth routing structures 323 (e.g., the fifth routing structures 323 not in electrical communication with the tenth conductive interconnect structures 321 in electrical communication with the gate structure 318) may be in electrical communication with tenth conductive interconnect structures 321 that are, in turn, in electrical communication with one of the source regions 317A or one of the drain regions 317B, as illustrated in FIG. 3B and FIG. 3C.

Each of the gate structures 319, the tenth conductive interconnect structure 321, and the fifth routing structures 323 may individually be formed of and include conductive material, such as one or more of the materials described above with reference to the first conductive interconnect structure 182. In some embodiments, the gate structures 319, the tenth conductive interconnect structure 321, and the fifth routing structures 323 are individually formed of and include tungsten. In other embodiments, the gate structures 319, the tenth conductive interconnect structure 321, and the fifth routing structures 323 are individually formed of and include copper.

Referring now to FIG. 3A, the second sense amplifier device region 303 includes transistor structures 311. At least some of the transistor structures 311 within the second sense amplifier device region 303 may be in electrical communication with eleventh conductive interconnect structures 325 by means of the fifth routing structures 323. The eleventh conductive interconnect structures 325 are, in turn, in electrical communication with the global digit lines 308, which include first global digit lines 308A and second global digit lines 308B, as described above with reference to the global digit lines 108. In some such embodiments, the second sense amplifier device region 303 comprises sense amplifier devices that are in electrical communication with the global digit lines 308, as described above with reference to the sense amplifier devices of the first sense amplifier device region 262. In some embodiments, each sense amplifier device of the second sense amplifier device region 303 is in electrical communication with one of the first global digit lines 308A and one of the second global digit lines 308B. In use and operation, the sense amplifier devices of the second sense amplifier device region 303 are configured to amplify a signal (e.g., a difference in voltage) between the first global digit line 308A and the second global digit line 108B to which the sense amplifier device is connected.

In some embodiments, the second sense amplifier device region 303 further comprises transistor structures 311 forming column select devices that are in electrical communication with the sense amplifiers of the second sense amplifier device region 303, such as by means of the fifth routing structures 323 and one or more additional conductive interconnect structures and/or additional routing structures.

In some embodiments, a voltage of the global digit lines 308 may be selectively provided to one of the conductive pillar structures 360 extending through the vertical stack of memory cells 320 by applying a voltage to the multiplexer 366 electrically connecting the global digit line 308 to the conductive pillar structure 360 by means of the global digit line contact structures 362 and the conductive structures 364 between the global digit line 308 and the multiplexer 366, as described above with reference to the global digit lines 108, the global digit line contact structures 162, the conductive structures 164, the multiplexers 166, and the conductive pillar structures 160.

With reference to FIG. 3A through FIG. 3C, the fifth routing structures 323 in electrical communication with at least some of the transistor structures 311 within horizontal boundaries of the second array region 309 are in electrical communication with twelfth conductive interconnect structures 327 that are, in turn in electrical communication with sixth routing structures 329. The sixth routing structures 329 are in electrical communication with thirteenth conductive interconnect structures 331 that vertically extend (e.g., in the Z-direction) through the isolation trenches 313 to the back side of the third base structure 310. As will be described in further detail herein, the thirteenth conductive interconnect structures 331 may be electrically coupled to back end of line (BEOL) structures and/or input/out devices to be formed over portions of the third base structure 310. In some embodiments, the thirteenth conductive interconnect structures 331 are located in a different plane than the plane in which the conductive gates 318 extend such that the thirteenth conductive interconnect structures 331 do not electrically short to the conductive gates 318. Accordingly, the thirteenth conductive interconnect structures 331 are illustrated in broken lines in FIG. 3A to indicate that the thirteenth conductive interconnect structures 331 are located in a different plane than the conductive gates 318.

Each of the eleventh conductive interconnect structures 325, the twelfth conductive interconnect structures 327, the sixth routing structures 329, and the thirteenth conductive interconnect structures 331 may individually be formed of and include conductive material, such as one or more of the materials described above with reference to the first conductive interconnect structures 182. In some embodiments, each of the eleventh conductive interconnect structures 325, the twelfth conductive interconnect structures 327, the sixth routing structures 329, and the thirteenth conductive interconnect structures 331 are individually formed of and include tungsten. In other embodiments, each of the eleventh conductive interconnect structures 325, the twelfth conductive interconnect structures 327, the sixth routing structures 329, and the thirteenth conductive interconnect structures 331 are individually formed of and include copper.

The one or more additional CMOS device regions 307 may include one or more control logic devices configured for effectuating control operations of the memory cells 120 of the first microelectronic device structure 100, the memory cells 320 of the third microelectronic device structure 300, or both. By way of non-limiting example, the one or more additional CMOS device regions 307 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), one or more data output devices (e.g., DQU, DQL), data input/output terminals (e.g., DQ pins, DQ pads), drain supply voltage ($V_{DD}$) regulators, control devices configured to control column operations and/or row operations for arrays (e.g., the first array region 101, the second array region 309) of the first microelectronic device structure 100 and the third microelectronic device structure 300, such as decoders (e.g., local deck decoders), repair circuitry (e.g., column repair circuitry, row repair circuitry), memory test devices, array multiplexers (MUX), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry. The devices and circuitry included in the one or more additional CMOS device regions 307 may employ different conventional conductive metal-oxide-semiconductor (CMOS) devices (e.g., conventional CMOS inverters, conventional CMOS NAND gates, conventional CMOS transmission pass gates, etc.), which are not described in detail herein.

With collective reference to FIG. 3A through FIG. 3C, and as described above with reference to FIG. 1A through FIG. 1D, the second array region 309 includes a vertical stack of memory cells 320, each comprising a vertical stack of access devices 330 (each including a channel material 334 between a source material 336 and a drain material 338) and a vertical stack of storage devices 350 neighboring the vertical stack of access devices 330, the storage devices 350 of the vertical stack of storage devices 350 coupled to the access devices 330 of the vertical stack of access devices 330. Although FIG. 3A illustrates forty (40) vertical stacks of memory cells 320, the disclosure is not so limited, and the second array region 309 may include greater than forty vertical stacks of memory cells 320.

With reference to FIG. 3C, fifth pad structures 378 may be formed in electrical communication with the conductive structures 332 of the steps 375 of the staircase structure 374 by means of additional first conductive contact structures 376, as described above with reference to the first pad structures 178, the first conductive contact structures 176, and the conductive structures 132.

The global digit lines 308 may be vertically between (e.g., in the Z-direction) the third base structure 310 and the vertical stacks of memory cells 320. In some embodiments, the multiplexers 366 are located within the vertical stacks of memory cells 320 (and comprise a portion of the vertical stacks of memory cells 320) and are the nearest ones of the access devices 330 of the vertical stacks to the global digit lines 308. As described above with reference to the multiplexers 166, the multiplexers 366 may be configured to selectively electrically connect one of the global digit lines 308 to the conductive pillar structure 360 by selective application of a voltage to the multiplexer 366.

Vertically neighboring (e.g., in the Z-direction) memory cells 320 may be electrically isolated from one another by insulative structures 337 and additional insulative structures 339, as described above with reference to the insulative structures 137 and the additional insulative structures 139.

In some embodiments, an access device 330 vertically (e.g., in the Z-direction) neighboring (e.g., vertically above) the multiplexer 366 may comprise a transistor 370, one of which is illustrated in box 371, configured to electrically couple the conductive pillar structure 360 to the conductive structure 342 through an additional conductive structure 372. The transistor 370 may comprise a so-called "bleeder" transistor, as described above with reference to the transistors 170. In use and operation, the transistors 370 are configured to provide a negative voltage to the conductive pillar structures 360 of unselected (e.g., inactive) vertical stacks of memory cells 320.

In some embodiments, the multiplexers 366 and the transistors 370 are located vertically between (e.g., in the Z-direction) the second control logic device region 305 and the memory cells 320 of the vertical stack of memory cells 320. In some embodiments, the vertically lowermost (e.g., in the Z-direction) conductive structure 332 is in electrical communication the multiplexer 366.

With continued reference to FIG. 3C, in some embodiments, conductive interconnect structures 399 may be in electrical communication with conductive structures 332 that are in electrical communication with the multiplexers 366 and the transistors 370 to electrically connect the multiplexers 366 and the transistors 370 to one or more transistor structures 311 within the one or more additional CMOS device regions 307 (e.g., such as to transistor structures 311 of a multiplexer controller region). The conductive interconnect structures 399 may individually be formed of and include conductive material, such as one or more of the materials described above with reference to the first conductive interconnect structures 182.

A ninth insulative material 380 may vertically overlie (e.g., in the Z-direction) the third microelectronic device structure 300. The ninth insulative material 380 may be formed of and include one or more insulative materials, such as one or more of the materials described above with reference to the first insulative material 112. In some embodiments, the ninth insulative material 380 comprises silicon dioxide.

Figure 3D:
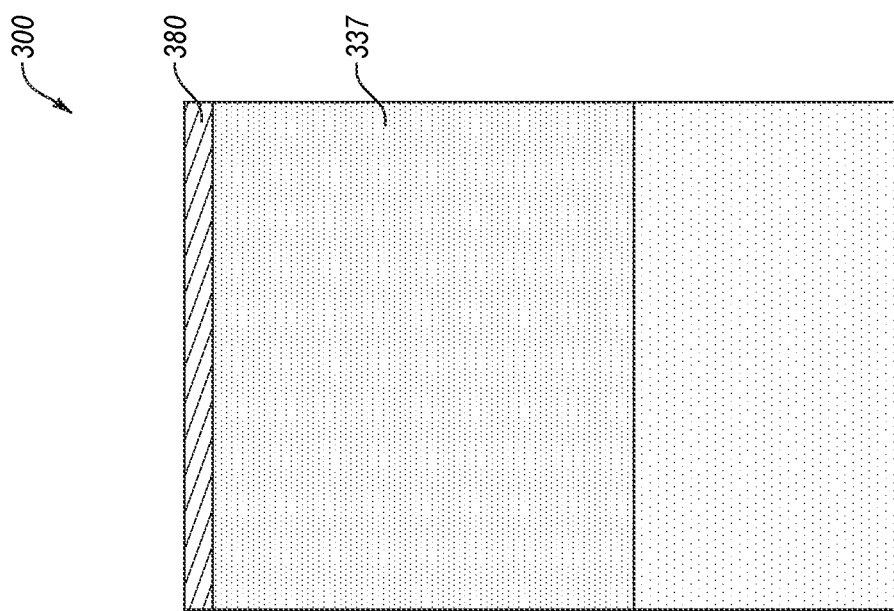

With reference to FIG. 3D, the insulative structure 337 may vertically overlie (e.g., in the Z-direction) the eighth insulative material 312 and a ninth insulative material 380 may vertically overlie the ninth insulative structure 337.

Figure 4A:
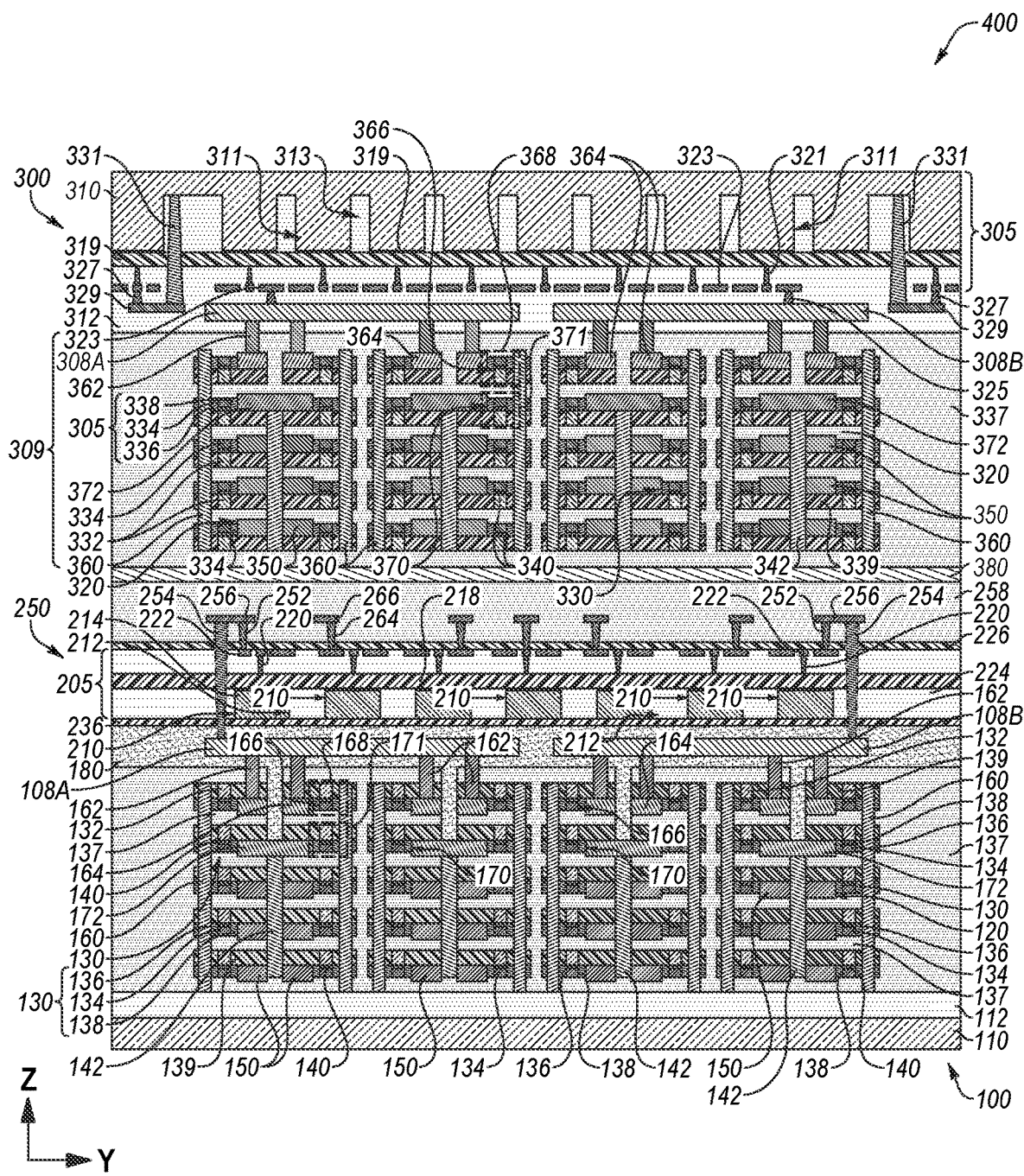
FIG. 4A through FIG. 4H include simplified partial cross-sectional views illustrating a method of forming a second microelectronic device structure assembly including the third microelectronic device structure attached to the first microelectronic device structure assembly and a method of forming a microelectronic device, in accordance with embodiments of the disclosure.
Figure 4B:
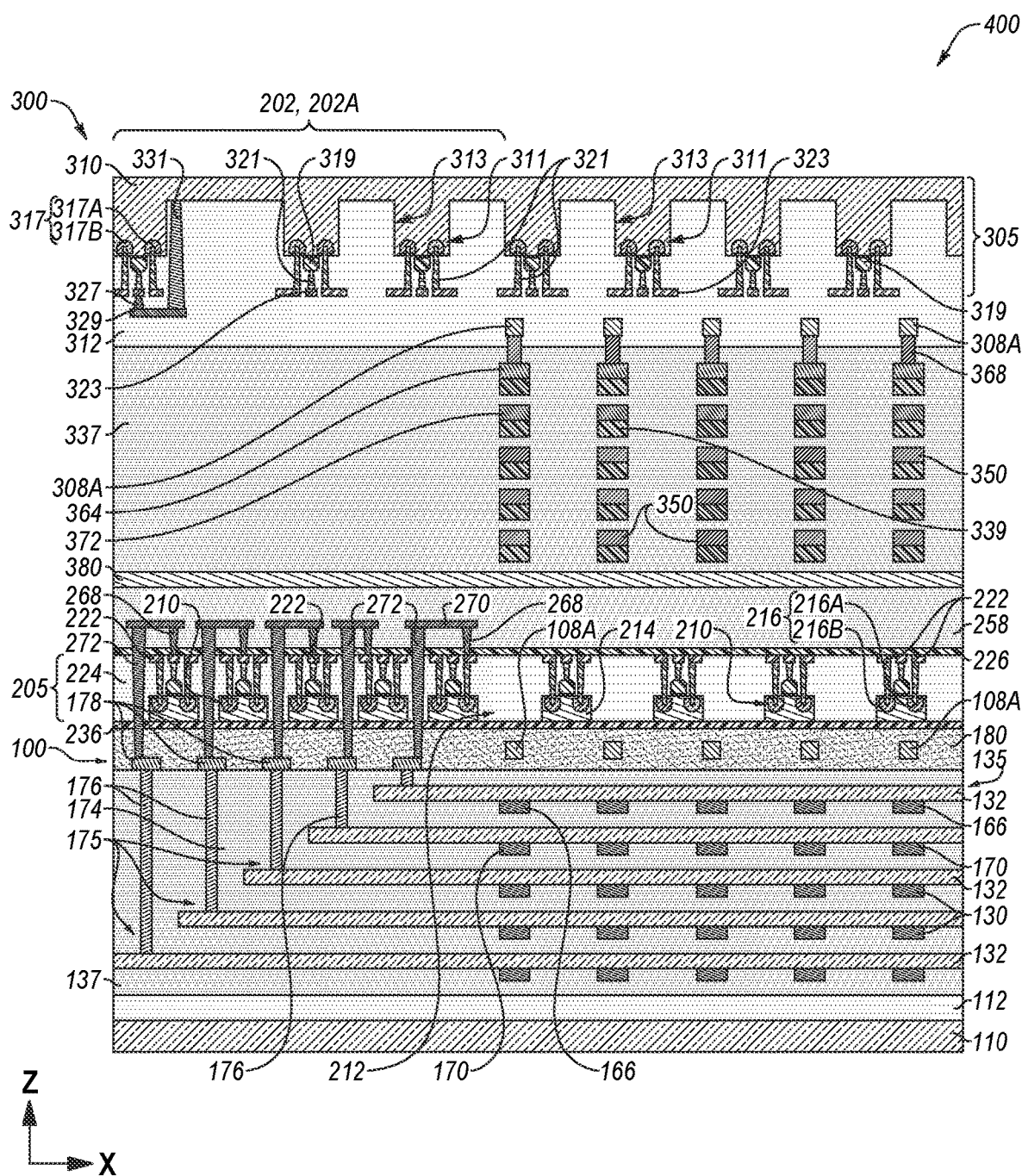
Figure 4C:
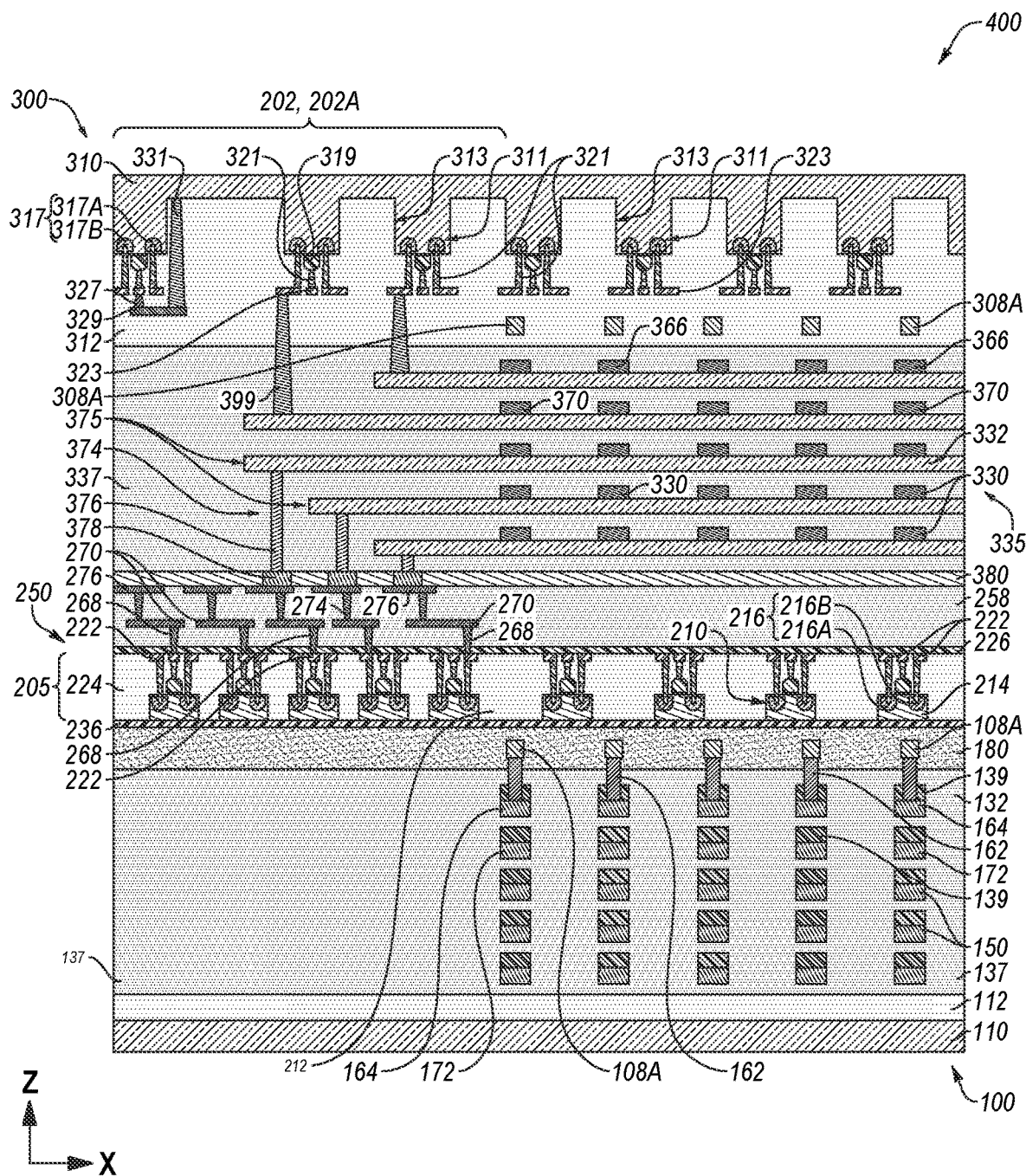
Figure 4D:
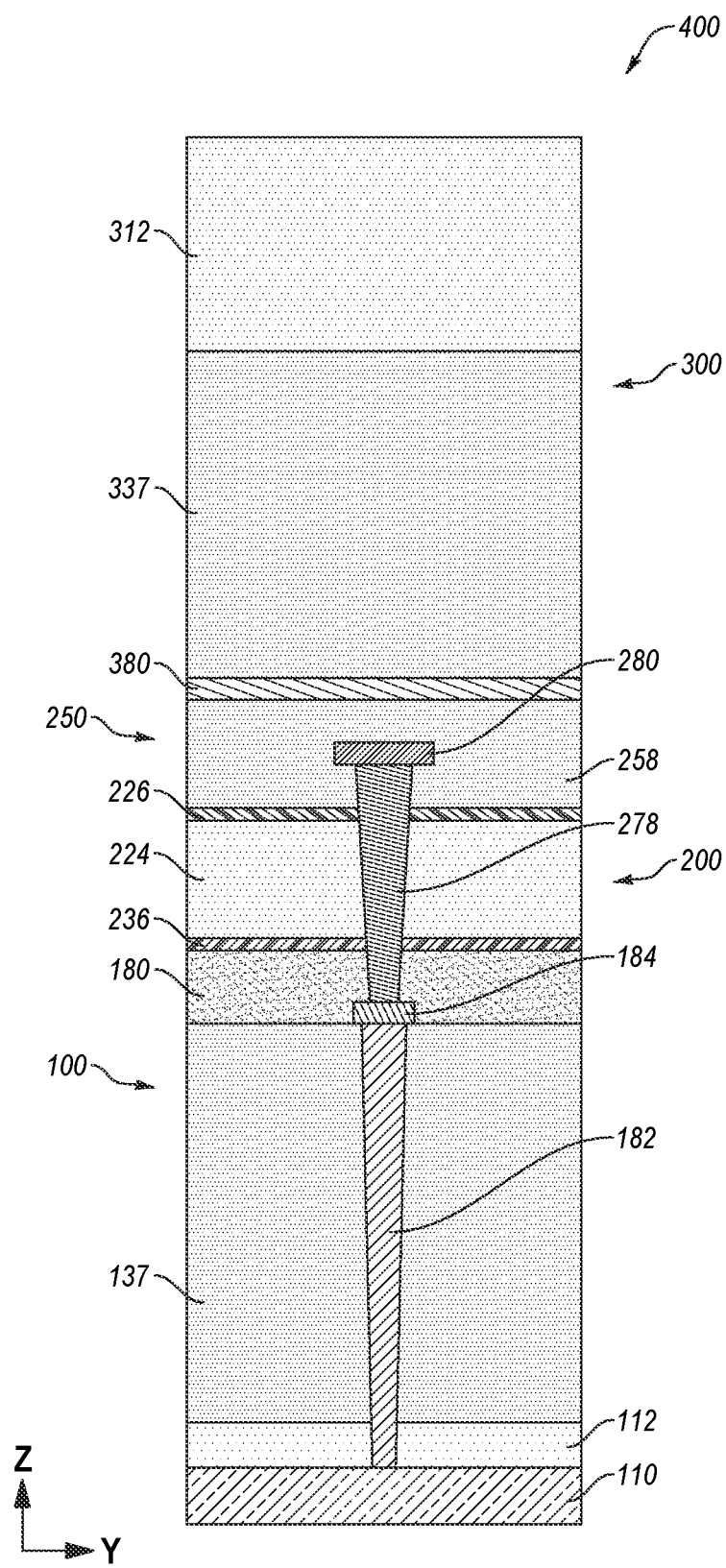

FIG. 4A through FIG. 4D are simplified partial cross-sectional views of a second microelectronic device structure assembly 400 formed by vertically (e.g., in the Z-direction) inverting (e.g., flipping) the third microelectronic device structure 300 and attaching the third microelectronic device structure 300 to the first microelectronic device structure assembly 250. FIG. 4A is a simplified partial cross-sectional view illustrating the same cross-sectional view as that illustrated in FIG. 2J and FIG. 3A; FIG. 4B is a simplified partial cross-sectional view illustrating the same cross-sectional view as that illustrated in FIG. 2K and FIG. 3B; FIG. 4C is a simplified partial cross-sectional view illustrating the same cross-sectional view as that illustrated in FIG. 2L and FIG. 3C; and FIG. 4D is a simplified partial cross-sectional view illustrating the same cross-sectional view as that illustrated in FIG. 2M and FIG. 3D.

The third microelectronic device structure 300 may be attached to the first microelectronic device structure assembly 250 by placing the ninth insulative material 380 in contact with the seventh insulative material 258 and exposing the third microelectronic device structure 300 and the first microelectronic device structure assembly 250 to annealing conditions to form bonds (e.g., oxide-to-oxide bonds) between the ninth insulative material 380 and the seventh insulative material 258. In some embodiments, the third microelectronic device structure 300 and the first microelectronic device structure assembly 250 are exposed to a temperature greater than, for example, 800° C., to form the oxide-to-oxide bonds and attach the third microelectronic device structure 300 to the first microelectronic device structure assembly 250.

With reference to FIG. 4C, in some embodiments, within the second sub word line driver regions 202B (FIG. 2L), attaching the third microelectronic device structure 300 to the first microelectronic device structure assembly 250 includes forming metal to metal bonds between the third pad structures 276 and the fifth pad structures 378 of the third microelectronic device structure 300. In some such embodiments, attaching the third microelectronic device structure 300 to the first microelectronic device structure assembly 250 comprises forming oxide-to-oxide bonds between the ninth insulative material 380 in contact with the seventh insulative material 258 and metal to metal bonds between the third pad structures 276 and the fifth pad structures 378.

With collective reference to FIG. 4B and FIG. 4C, in some embodiments, the first sub word line driver region 202A may be horizontally aligned (e.g., in the Y-direction) with the staircase structure 174, the first conductive contact structures 176, and the first pad structures 178 of the first microelectronic device structure 100 and horizontally offset (e.g., in the Y-direction) from the staircase structures 374 (FIG. 4C), the additional first conductive contact structures 376 (FIG. 4C), and the fifth pad structures 378 (FIG. 4C) of the third microelectronic device structure 300. In some such embodiments, the steps 375 of the staircase structures 374 are horizontally offset (e.g., in the Y-direction) from the steps 175 of the staircase structures 174. In some embodiments, the second sub word line driver region 202B may be horizontally aligned (e.g., in the Y-direction) with the staircase structure 374, the additional first conductive contact structures 376, and the fifth pad structures 378 of the third microelectronic device structure 300 and horizontally offset (e.g., in the Y-direction) from the staircase structure 174, the first conductive contact structures 176, and the first pad structures 178 of the first microelectronic device structure 100.

Figure 4E:
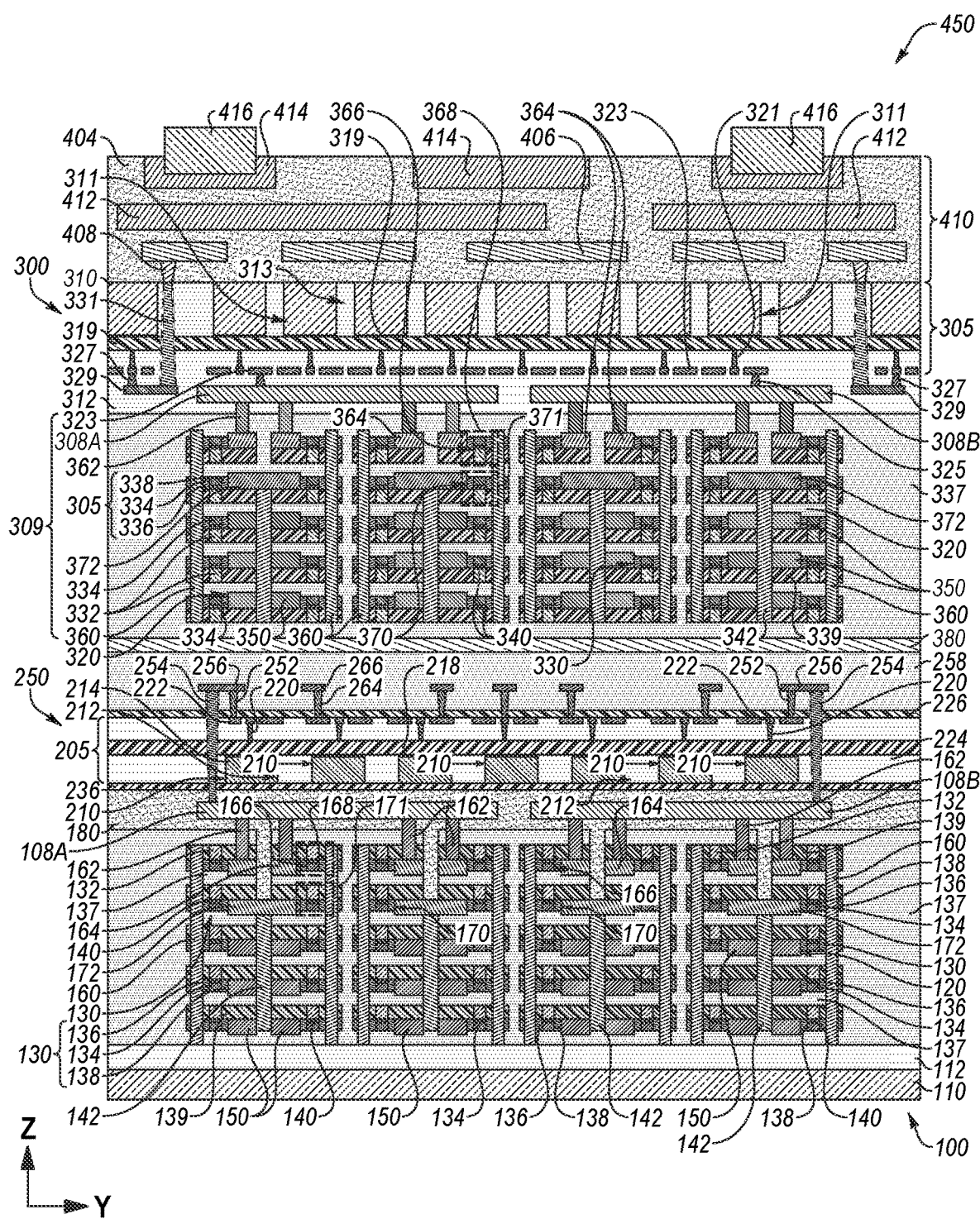
Figure 4F:
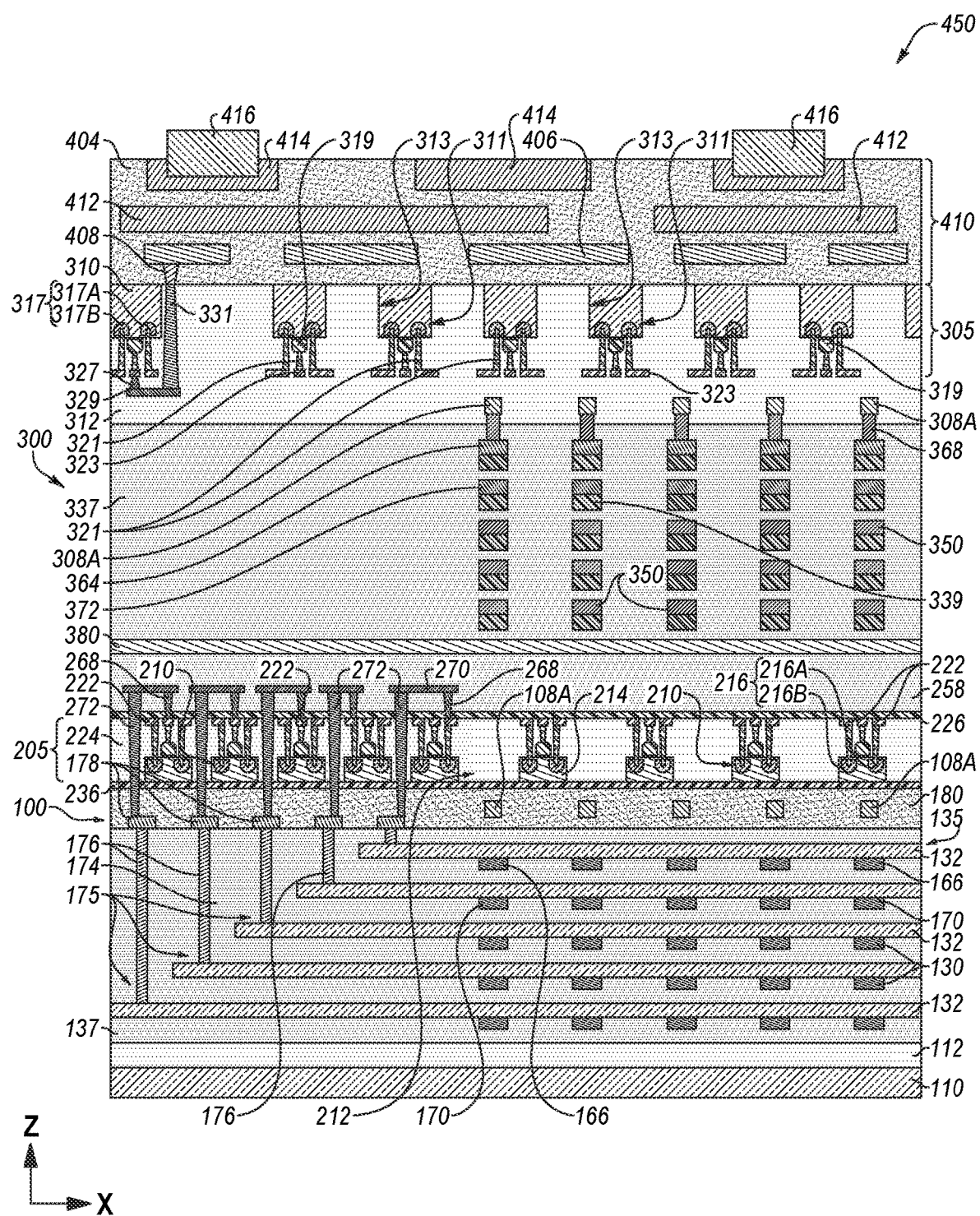
Figure 4G:
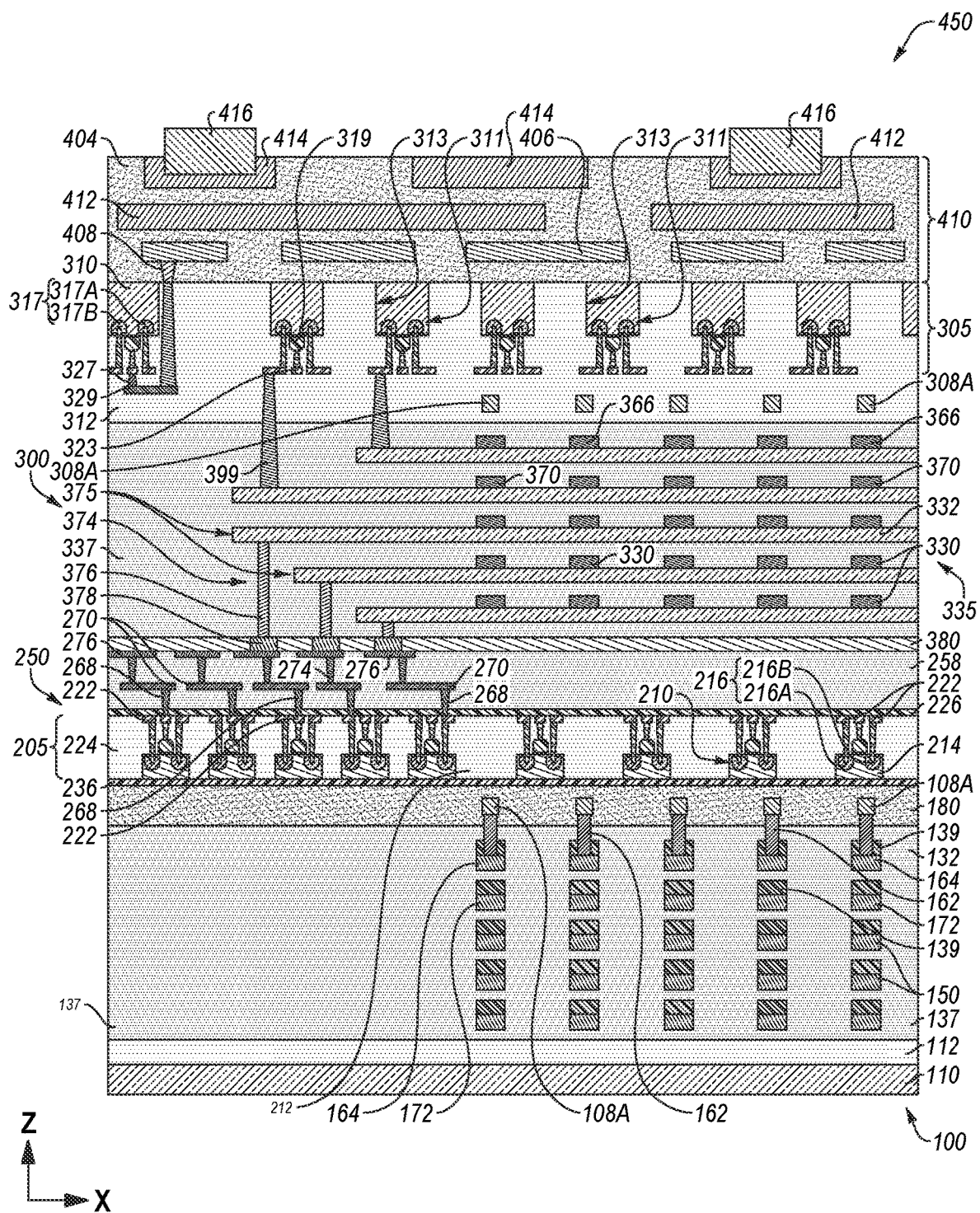
Figure 4H:
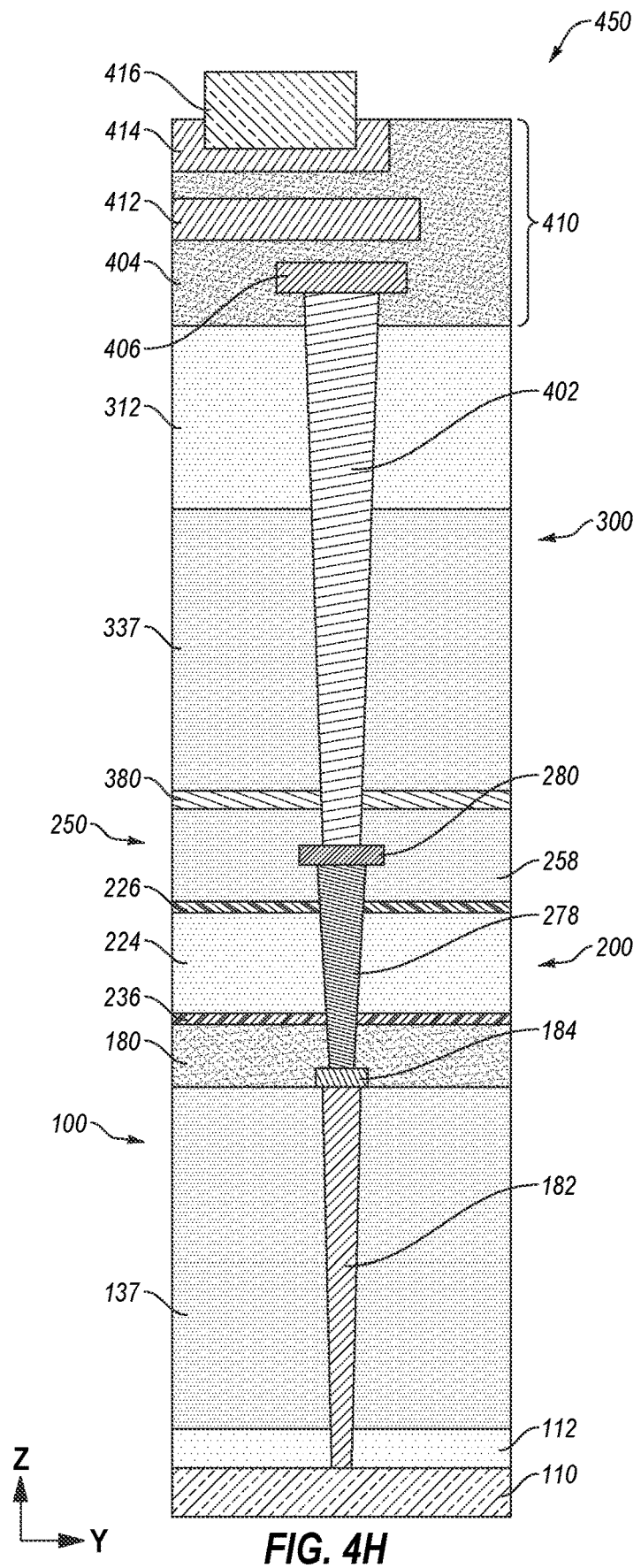

FIG. 4E through FIG. 4H illustrate the second microelectronic device structure assembly 400 at a processing stage after the processing stage illustrated in FIG. 4A through FIG. 4D. FIG. 4E is a simplified partial cross-sectional view of the second microelectronic device structure assembly 400 illustrating the same cross-sectional view as FIG. 4A; FIG. 4F is simplified partial cross-sectional view of the second microelectronic device structure assembly 400 illustrating the same cross-sectional view as FIG. 4B; FIG. 4G is a simplified partial cross-sectional view of the second microelectronic device structure assembly 400 illustrating the same cross-sectional view as FIG. 4C; and FIG. 4H is a simplified partial cross-sectional view of the second microelectronic device structure assembly 400 illustrating the same cross-sectional view as FIG. 4D.

With collective reference to FIG. 4E through FIG. 4H, after attaching the third microelectronic device structure 300 to the first microelectronic device structure assembly 250 to form the second microelectronic device structure assembly 400, the third base structure 310 may be vertically (e.g., in the Z-direction) thinned by exposing the third base structure 310 to a CMP process. In other embodiments, the third base structure 310 is vertically thinned by exposing the third base structure 310 to a dry etch. Vertically thinning the third base structure 310 may electrically isolate the transistor structures 311 from one another.

After vertically thinning the third base structure 310, fourteenth conductive interconnect structures 402 (FIG. 4H) may be formed vertically (e.g., in the Z-direction) the socket regions 204 and in electrical communication with the fourth pad structures 280 (FIG. 4H) of the socket regions 204; and a back end of line (BEOL) structure 410 may be formed vertically over (e.g., in the Z-direction) the second microelectronic device structure assembly 400 to form a microelectronic device 450.

Referring to FIG. 4H, the fourteenth conductive interconnect structures 402 may vertically extend (e.g., in the Z-direction) through a tenth insulative material 404, the eighth insulative material 312, the insulative structure 337, the ninth insulative material 380, and the seventh insulative material 258 to contact the fourth pad structure 280. Each of the fourteenth conductive interconnect structures 402 may individually be in electrical communication with a sixth pad structure 406.

With collective reference to FIG. 4E through FIG. 4H, fifteenth conductive interconnect structures 408 (FIG. 4E through FIG. 4G) may be formed in electrical communication with the thirteenth conductive interconnect structures 331 and sixth pad structures 406 are formed in electrical communication with the fifteenth conductive interconnect structures 408.

Each of the fourteenth conductive interconnect structures 402, the fifteenth conductive interconnect structures 408, and the sixth pad structures 406 may individually be formed of and include conductive material, such as one or more of the materials described above with reference to the first conductive interconnect structures 182. In some embodiments, each of the fourteenth conductive interconnect structures 402, the fifteenth conductive interconnect structures 408, and the sixth pad structures 406 are formed of and include tungsten. In other embodiments, each of the fourteenth conductive interconnect structures 402, the fifteenth conductive interconnect structures 408, and the sixth pad structures 406 are formed of and include copper.

Conductive line structures 412 may be formed vertically over (e.g., in the Z-direction) the sixth pad structures 406, seventh pad structures 414 may be formed vertically over the conductive line structures 412, and conductive landing pad structures 416 may be formed in electrical communication with the seventh pad structures 414. In some embodiments, conductive interconnect structures vertically extend between and electrically connect at least some of the sixth pad structures 406 to at least some of the conductive line structures 412; and at least some of the conductive line structures 412 to at least some of the seventh pad structures 414.

Each of the conductive line structures 412, the seventh pad structure 414, and the conductive landing pad structures 416 are formed of and include conductive material. Each of the conductive line structures 412, the seventh pad structures 414, and the conductive landing pad structures 416 may individually be formed of and include tungsten. In other embodiments, each of the conductive line structures 412, the seventh pad structure 414, and the conductive landing pad structures 416 may individually be formed of and include copper. In yet other embodiments, each of the conductive line structures 412, the seventh pad structure 414, and the conductive landing pad structures 416 may individually be formed of and include aluminum.

The tenth insulative material 404 may be formed of and include insulative material, such as one or more of the materials described above with reference to the first insulative material 112. In some embodiments, the tenth insulative material 404 comprises silicon dioxide.

Accordingly, the microelectronic device 400 may include the first microelectronic device structure 100 comprising the first array region 101 including vertical stacks of memory cells 120 and the third microelectronic device structure 300 vertically above (e.g., in the Z-direction) the first microelectronic device structure 100 and comprising the second array region 309 including additional vertical stacks of memory cells 320. The second microelectronic device structure 200 including the first control logic device region 205 including the first sense amplifier device region 262 and each of the first sub word line driver regions 202A and the second sub word line driver regions 202B vertically intervenes (e.g., in the Z-direction) between the first microelectronic device structure 100 and the third microelectronic device structure 300. The third microelectronic device structure 300 includes a second control logic device region 305 including a second sense amplifier device region 303.

Forming the microelectronic device 450 to include the first microelectronic device structure 100 including the vertical stack of memory cells 120; the second microelectronic device structure 200 including the first control logic device region 205 including the first sub word line driver region 202A for the memory cells 120 of the first microelectronic device structure 100, the second sub word line driver region 202B for the memory cells 320 of the third microelectronic device structure 300, the first sense amplifier device region for sense amplifiers of the vertical stack of memory cells 120 of the first microelectronic device structure 100, and the first column select device region for the vertical stack of memory cells of the first microelectronic device structure 100; and the third microelectronic device structure 300 including the second control logic device region 305 including the second sense amplifier device region 303, and the one or more additional CMOS regions 307 may facilitate forming each of the first microelectronic device structure 100 to include a greater number of levels of memory cells 120 and the third microelectronic device structure 300 to include a greater number of levels of memory cells 320 in a smaller horizontal footprint (e.g., in the X-direction, in the Y-direction) compared to conventional microelectronic devices. In some embodiments, dividing at least some of the control logic circuitry among the first microelectronic device structure 100 (e.g., the multiplexers 166), the second microelectronic device structure 200 (e.g., the first control logic device region 205 including the first sub word line driver region 202A for the memory cells 120 of the first microelectronic device structure 100, the second sub word line driver region 202B for the memory cells 320 of the third microelectronic device structure 300, the first sense amplifier device region for sense amplifiers of the vertical stack of memory cells 120 of the first microelectronic device structure 100, and column select devices for the vertical stack of memory cells 120 of the first microelectronic device structure 100), and the third microelectronic device structure 300 (e.g., the second sense amplifier device region 303 for the memory cells 320 of the third microelectronic device structure 300, and the one or more additional CMOS regions 307) may facilitate forming a greater quantity of levels of memory cells 120, 320 within the first microelectronic device structure 100 and the third microelectronic device structure 300.

In some embodiments, placing at least some of the control logic circuitry vertically above the first microelectronic device structure 100 and vertically below the third microelectronic device structure 300 (e.g., the second control logic region 305) and placing at least some of the control logic circuitry vertically above both the first microelectronic device structure 100 and the third microelectronic device structure 300 facilitates forming the microelectronic device 450 to include a greater quantity and density of memory cells compared to conventional microelectronic devices. For example, the first sub word line driver region 202A and the second sub word line driver region 202B may be placed vertically between the first microelectronic device structure 100 and the third microelectronic device structure 300 (and within horizontal boundaries of each of the staircase structures 174, 374) facilitates formation of electrical connections for the sub word line driver circuitry within a smaller area compared to conventional microelectronic devices.

Thus, in accordance with some embodiments, a microelectronic device comprises a first microelectronic device structure, a second microelectronic device structure vertically neighboring the first microelectronic device structure, and a third microelectronic device structure vertically neighboring the second microelectronic device structure. The first microelectronic device structure comprises a first memory array region comprising a vertical stack of storage devices, a vertical stack of access devices horizontally neighboring and in electrical communication with the vertical stack of storage devices, conductive lines operatively associated with the vertical stack of access devices and extending in a horizontal direction, horizontal ends of the conductive lines forming a staircase structure, and conductive contact structures in electrical communication with the conductive lines at steps of the staircase structure. The second microelectronic device structure comprises a control logic device region comprising a first sub word line driver region comprising transistor structures in electrical communication with the conductive contact structures, and a second sub word line driver region comprising additional transistor structures horizontally spaced from the first sub word line driver region. The third microelectronic device structure comprises a second memory array region comprising an additional vertical stack of storage devices, an additional vertical stack of access devices horizontally neighboring and in electrical communication with the additional vertical stack of storage devices, additional conductive lines operatively associated with the additional vertical stack of access devices and extending in the horizontal direction, horizontal ends of the additional conductive lines forming an additional staircase structure, and additional conductive contact structures in electrical communication with the additional conductive lines at steps of the additional staircase structure and the additional transistor structures of the second sub word line driver region.

Furthermore, in accordance with additional embodiments of the disclosure, a microelectronic device comprises a first die comprising a stack structure comprising alternating conductive structures and insulative structures intersecting vertical stacks of memory cells, horizontal edges of the alternating conductive structures and insulative structures defining steps of a staircase structure, and conductive contact structures in electrical communication with the conductive structures at the steps of the staircase structure. The microelectronic device further comprises a second die vertically spaced from the first die and comprising an additional stack structure comprising alternating additional conductive structures and additional insulative structures intersecting additional vertical stacks of memory cells, horizontal edges of the alternating additional conductive structures and additional insulative structures defining steps of an additional staircase structure, and additional conductive contact structures in electrical communication with the additional conductive structures at the steps of the additional staircase structure. The microelectronic device further comprises a third die vertically between the first die and the second die and comprising first sub word line drivers in electrical communication with the conductive contact structures, and second sub word line drivers in electrical communication with the additional conductive contact structures and horizontally neighboring the first sub word line drivers in a horizontal direction.

Moreover, in accordance with some embodiments of the disclosure, a method of forming a microelectronic device comprises forming a first microelectronic device structure comprising a memory array region comprising vertical stacks of memory cells, a stack structure intersecting the vertical stacks of memory cells and comprising conductive structures defining steps of a staircase structure, conductive contact structures individually in electrical communication with each step of the staircase structure, and a first oxide material overlying the memory array region. The method further comprises forming a second microelectronic device structure comprising a first sub word line driver region, a second sub word line driver region, and a second oxide material overlying the first sub word line driver region and the second sub word line driver region. The method further comprises attaching the first microelectronic device structure to the second microelectronic device structure to form a microelectronic device structure assembly, attaching the first microelectronic device structure to the second microelectronic device structure comprising horizontally aligning the conductive contact structures with circuitry of the first sub word line driver region, and bonding the first oxide material to the second oxide material. The method further includes forming a third microelectronic device structure comprising an additional memory array region comprising additional vertical stacks of memory cells, an additional stack structure intersecting the additional vertical stacks of memory cells and comprising additional conductive structures defining steps of an additional staircase structure, additional conductive contact structures individually in electrical communication with each step of the additional staircase structure, and a third oxide material overlying the additional memory array region. The third microelectronic device structure is attached to the microelectronic device structure assembly by horizontally aligning the additional conductive contact structures with the second sub word line driver region, and bonding the third oxide material to a fourth oxide material of the microelectronic device structure assembly.

Figure 5:
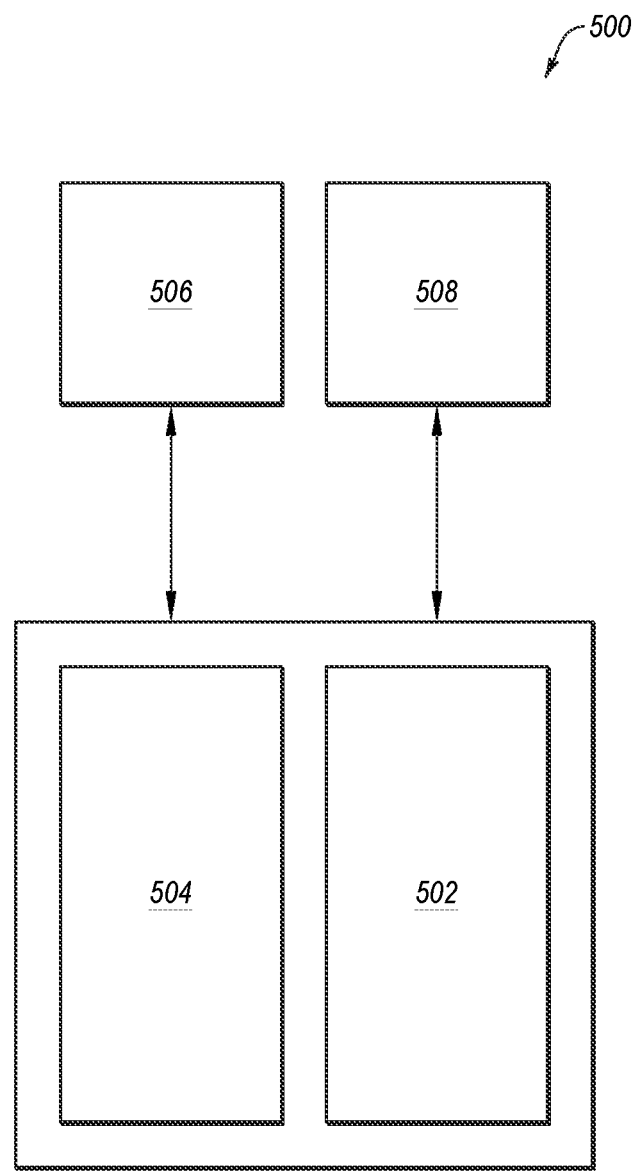
FIG. 5 is a schematic block diagram of an electronic system, in accordance with an embodiment of the disclosure.

Structures, assemblies, and devices in accordance with embodiments of the disclosure may be included in electronic systems of the disclosure. For example, FIG. 5 is a block diagram of an illustrative electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes at least one memory device 502. The memory device 502 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 4H. The electronic system 500 may further include at least one electronic signal processor device 504 (often referred to as a "microprocessor"). The electronic signal processor device 504 may, optionally, include an embodiment of one or more of a microelectronic device structure, a microelectronic device structure assembly, a relatively larger microelectronic device structure assembly, and a microelectronic device previously described herein with reference to FIG. 1A through FIG. 4H. While the memory device 502 and the electronic signal processor device 504 are depicted as two (2) separate devices in FIG. 5, in additional embodiments, a single (e.g., only one) memory/processor device having the functionalities of the memory device 502 and the electronic signal processor device 504 is included in the electronic system 500. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 4H. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, one or more of a monitor, a display, a printer, an audio output jack, and a speaker. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, in accordance with embodiments of the disclosure, an electronic system comprises an input device, an output device, a processor device operably coupled to the input device and the output device, and a memory device operably coupled to the processor device. The memory device comprises a first die and a second die attached to the first die. The first die comprises a memory array region comprising vertical stacks of memory cells, conductive lines horizontally extending through the vertical stacks of memory cells, each conductive line of the conductive lines associated with a level of the memory cells of the vertical stacks of memory cells, conductive pillar structures vertically extending through the vertical stacks of memory cells, each conductive pillar structure of the conductive pillar structures vertically extending through access devices of the vertical stacks of memory cells, and conductive contact structures in electrical communication with the conductive lines. The second die comprises a sub word line driver region comprising sub word line drivers in electrical communication with the conductive contact structures. The memory device further comprises a third die attached to the second die opposite the first die, the third die comprising an additional memory array region comprising additional vertical stacks of memory cells, additional conductive lines horizontally extending through the additional vertical stacks of memory cells, each additional conductive line of the additional conductive lines associated with a level of the memory cells of the additional vertical stacks of memory cells, and complementary metal-oxide semiconductor (CMOS) circuits farther from the second die than the additional memory array region.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    a first microelectronic device structure comprising:
        a first memory array region comprising:
            a vertical stack of storage devices;
            a vertical stack of access devices horizontally neighboring and in electrical communication with the vertical stack of storage devices;
            conductive lines operatively associated with the vertical stack of access devices and extending in a horizontal direction, horizontal ends of the conductive lines forming a staircase structure; and
            conductive contact structures in electrical communication with the conductive lines at steps of the staircase structure;
    a second microelectronic device structure vertically neighboring the first microelectronic device structure, the second microelectronic device structure comprising:
        a control logic device region comprising:
            a first sub word line driver region comprising transistor structures in electrical communication with the conductive contact structures; and
            a second sub word line driver region comprising additional transistor structures horizontally spaced from the first sub word line driver region; and
    a third microelectronic device structure comprising:
        a second memory array region comprising:
            an additional vertical stack of storage devices;
            an additional vertical stack of access devices horizontally neighboring and in electrical communication with the additional vertical stack of storage devices;
            additional conductive lines operatively associated with the additional vertical stack of access devices and extending in the horizontal direction, horizontal ends of the additional conductive lines forming an additional staircase structure; and
            additional conductive contact structures in electrical communication with the additional conductive lines at steps of the additional staircase structure and the additional transistor structures of the second sub word line driver region; and
        an additional control logic device region.

2. The microelectronic device of claim 1, wherein the transistor structures of the first sub word line driver region are vertically aligned with the additional transistor structures of the second sub word line driver region.

3. The microelectronic device of claim 1, wherein the additional staircase structure is horizontally aligned with the staircase structure in the horizontal direction and horizontally offset from the staircase structure in an additional horizontal direction.

4. The microelectronic device of claim 1, further comprising global digit lines between the vertical stack of storage devices and the second microelectronic device structure.

5. The microelectronic device of claim 1, wherein the vertical stack of storage devices comprises a vertical stack of capacitors.

6. The microelectronic device of claim 1, wherein the additional control logic device region comprises a sense amplifier device region comprising sense amplifiers in electrical communication with the second memory array region.

7. The microelectronic device of claim 1, wherein the additional control logic device region comprises one or more of charge pumps, delay-locked loop (DLL) circuitry, and data output devices.

8. The microelectronic device of claim 1, further comprising a back end of line (BEOL) structure on a side of the third microelectronic device structure opposite the second microelectronic device structure.

9. The microelectronic device of claim 1, wherein a conductive line of the conductive lines is in electrical communication with a transistor of a multiplexer controller region.

10. A microelectronic device, comprising:
    a first microelectronic device structure comprising:
        a first memory array region comprising:
            a vertical stack of storage devices;
            a vertical stack of access devices horizontally neighboring and in electrical communication with the vertical stack of storage devices;
            conductive lines operatively associated with the vertical stack of access devices and extending in a horizontal direction, horizontal ends of the conductive lines forming a staircase structure; and
            conductive contact structures in electrical communication with the conductive lines at steps of the staircase structure;
    a second microelectronic device structure vertically neighboring the first microelectronic device structure, the second microelectronic device structure comprising:
        a control logic device region comprising:
            a first sub word line driver region comprising transistor structures in electrical communication with the conductive contact structures;
            a second sub word line driver region comprising additional transistor structures horizontally spaced from the first sub word line driver region; and
            a sense amplifier device region comprising sense amplifiers in electrical communication with the first memory array region;

a third microelectronic device structure comprising:
　　a second memory array region comprising:
　　　　an additional vertical stack of storage devices;
　　　　an additional vertical stack of access devices horizontally neighboring and in electrical communication with the additional vertical stack of storage devices;
　　　　additional conductive lines operatively associated with the additional vertical stack of access devices and extending in the horizontal direction, horizontal ends of the additional conductive lines forming an additional staircase structure; and
　　　　additional conductive contact structures in electrical communication with the additional conductive lines at steps of the additional staircase structure and the additional transistor structures of the second sub word line driver region.

11. The microelectronic device of claim 10, wherein the third microelectronic device structure comprises an additional sense amplifier device region comprising additional sense amplifiers in electrical communication with the second memory array region.

12. A microelectronic device, comprising:
　　a first die comprising:
　　　　a stack structure comprising alternating conductive structures and insulative structures intersecting vertical stacks of memory cells, horizontal edges of the alternating conductive structures and insulative structures defining steps of a staircase structure; and
　　　　conductive contact structures in electrical communication with the conductive structures at the steps of the staircase structure;
　　a second die vertically spaced from the first die, the second die comprising:
　　　　an additional stack structure comprising alternating additional conductive structures and additional insulative structures intersecting additional vertical stacks of memory cells, horizontal edges of the alternating additional conductive structures and additional insulative structures defining steps of an additional staircase structure; and
　　　　additional conductive contact structures in electrical communication with the additional conductive structures at the steps of the additional staircase structure; and
　　a third die vertically between the first die and the second die, the third die comprising:
　　　　first sub word line drivers in electrical communication with the conductive contact structures;
　　　　second sub word line drivers in electrical communication with the additional conductive contact structures and horizontally neighboring the first sub word line drivers in a horizontal direction; and
　　　　a sense amplifier device region horizontally neighboring the first sub word line drivers in an additional horizontal direction different from the horizontal direction and comprising sense amplifiers in electrical communication with the vertical stacks of memory cells of the first die.

13. The microelectronic device of claim 12, wherein the vertical stacks of memory cells comprise:
　　vertical stacks of storage devices;
　　vertical stacks of access devices horizontally neighboring the vertical stacks of storage devices; and
　　a conductive pillar structure vertically extending through each vertical stack of access devices.

14. The microelectronic device of claim 12, wherein:
　　the second die comprises pad structures in electrical communication with the second sub word line drivers; and
　　the third die comprises additional pad structures in electrical communication with the additional conductive contact structures and bonded to the pad structures of the second die.

15. The microelectronic device of claim 12, wherein the first die is free of sub word line drivers and sense amplifiers.

16. The microelectronic device of claim 12, wherein the second die comprises additional sense amplifiers on a side of the second die opposite the third die.

17. The microelectronic device of claim 12, wherein the second die comprises complementary metal-oxide-semiconductor (CMOS) circuits.

18. The microelectronic device of claim 12, wherein:
　　a shortest conductive structure of the first die is located closer to the third die than a longest conductive structure of the first die; and
　　a shortest additional conductive structure of the second die is located closer to the third die than a longest additional conductive structure of the second die.

19. A microelectronic device, comprising:
　　a first die comprising:
　　　　a stack structure comprising alternating conductive structures and insulative structures intersecting vertical stacks of memory cells, horizontal edges of the alternating conductive structures and insulative structures defining steps of a staircase structure, and the vertical stacks of memory cells comprising:
　　　　vertical stacks of storage devices; and
　　　　vertical stacks of access devices horizontally neighboring the vertical stacks of storage devices;
　　　　conductive pillar structures vertically extending through the vertical stacks of access devices;
　　　　a global digit line in electrical communication with a plurality of the conductive pillar structures; and
　　　　conductive contact structures in electrical communication with the conductive structures at the steps of the staircase structure;
　　a second die vertically spaced from the first die, the second die comprising:
　　　　an additional stack structure comprising alternating additional conductive structures and additional insulative structures intersecting additional vertical stacks of memory cells, horizontal edges of the alternating additional conductive structures and additional insulative structures defining steps of an additional staircase structure; and
　　　　additional conductive contact structures in electrical communication with the additional conductive structures at the steps of the additional staircase structure; and
　　a third die vertically between the first die and the second die, the third die comprising:
　　　　first sub word line drivers in electrical communication with the conductive contact structures; and
　　　　second sub word line drivers in electrical communication with the additional conductive contact structures and horizontally neighboring the first sub word line drivers in a horizontal direction.

20. An electronic system, comprising:
　　an input device;
　　an output device;
　　a processor device operably coupled to the input device and the output device; and a memory device operably coupled to the processor device and comprising:
- a first die comprising:
  - a memory array region comprising vertical stacks of memory cells;
  - conductive lines horizontally extending through the vertical stacks of memory cells, each conductive line of the conductive lines associated with a level of the memory cells of the vertical stacks of memory cells;
  - conductive pillar structures vertically extending through the vertical stacks of memory cells, each conductive pillar structure of the conductive pillar structures vertically extending through access devices of the vertical stacks of memory cells; and
  - conductive contact structures in electrical communication with the conductive lines;
- a second die attached to the first die, the second die comprising:
  - a sub word line driver region comprising sub word line drivers in electrical communication with the conductive contact structures; and
- a third die attached to the second die opposite the first die, the third die comprising:
  - an additional memory array region comprising additional vertical stacks of memory cells;
  - additional conductive lines horizontally extending through the additional vertical stacks of memory cells, each additional conductive line of the additional conductive lines associated with a level of the memory cells of the additional vertical stacks of memory cells; and
  - complementary metal-oxide semiconductor (CMOS) circuits farther from the second die than the additional memory array region.

21. The electronic system of claim 20, wherein the second die comprises an additional sub word line driver region.

22. The electronic system of claim 21, wherein the additional sub word line driver region is in electrical communication with the additional conductive lines of the third die.

* * * * *